(12) United States Patent
Then et al.

(10) Patent No.: US 11,056,532 B2
(45) Date of Patent: Jul. 6, 2021

(54) TECHNIQUES FOR MONOLITHIC CO-INTEGRATION OF POLYCRYSTALLINE THIN-FILM BULK ACOUSTIC RESONATOR DEVICES AND MONOCRYSTALLINE III-N SEMICONDUCTOR TRANSISTOR DEVICES

(71) Applicant: INTEL CORPORATION, Santa Clara, CA (US)

(72) Inventors: Han Wui Then, Portland, OR (US); Marko Radosavljevic, Portland, OR (US); Sansaptak Dasgupta, Hillsboro, OR (US); Paul B. Fischer, Portland, OR (US); Sanaz K. Gardner, Portland, OR (US); Bruce A. Block, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 112 days.

(21) Appl. No.: 16/304,965

(22) PCT Filed: Jul. 1, 2016

(86) PCT No.: PCT/US2016/040762
§ 371 (c)(1),
(2) Date: Nov. 27, 2018

(87) PCT Pub. No.: WO2018/004666
PCT Pub. Date: Jan. 4, 2018

(65) Prior Publication Data
US 2020/0119087 A1    Apr. 16, 2020

(51) Int. Cl.
*H01L 27/20* (2006.01)
*H01L 21/02* (2006.01)
(Continued)

(52) U.S. Cl.
CPC .......... *H01L 27/20* (2013.01); *H01L 21/0254* (2013.01); *H01L 29/04* (2013.01);
(Continued)

(58) Field of Classification Search
None
See application file for complete search history.

(56) References Cited

U.S. PATENT DOCUMENTS 5,075,641 A * 12/1991 Weber .................. H01L 27/20
204/192.18
6,060,818 A * 5/2000 Ruby ..................... H03H 3/02
29/25.35
(Continued)

FOREIGN PATENT DOCUMENTS

WO    2018004666 A1    1/2018

OTHER PUBLICATIONS

International Search Report and Written Opinion received for PCT Application No. PCT/US2016/040762, dated Mar. 28, 2017. 13 pages.
(Continued)

*Primary Examiner* — Anthony Ho
*Assistant Examiner* — Kevin Quinto
(74) *Attorney, Agent, or Firm* — Schwabe, Williamson & Wyatt, P.C.

(57) ABSTRACT

Techniques are disclosed for monolithic co-integration of thin-film bulk acoustic resonator (TFBAR, also called FBAR) devices and III-N semiconductor transistor devices. In accordance with some embodiments, one or more TFBAR devices including a polycrystalline layer of a piezoelectric III-N semiconductor material may be formed alongside one or more III-N semiconductor transistor devices including a monocrystalline layer of III-N semiconductor material, over a commonly shared semiconductor substrate. In some
(Continued)

embodiments, either (or both) the monocrystalline and the polycrystalline layers may include gallium nitride (GaN), for example. In accordance with some embodiments, the monocrystalline and polycrystalline layers may be formed simultaneously over the shared substrate, for instance, via an epitaxial or other suitable process. This simultaneous formation may simplify the overall fabrication process, realizing cost and time savings, at least in some instances.

18 Claims, 8 Drawing Sheets

(51) Int. Cl.

| | |
|---|---|
| H01L 29/04 | (2006.01) |
| H01L 29/08 | (2006.01) |
| H01L 29/20 | (2006.01) |
| H01L 29/205 | (2006.01) |
| H01L 29/417 | (2006.01) |
| H01L 29/66 | (2006.01) |
| H01L 29/778 | (2006.01) |
| H01L 41/047 | (2006.01) |
| H01L 41/08 | (2006.01) |
| H01L 41/187 | (2006.01) |
| H01L 41/29 | (2013.01) |
| H01L 41/314 | (2013.01) |
| H03H 3/02 | (2006.01) |
| H03H 9/02 | (2006.01) |
| H03H 9/05 | (2006.01) |
| H03H 9/17 | (2006.01) |
| H03H 9/54 | (2006.01) |
| H03H 9/56 | (2006.01) |

(52) U.S. Cl.
CPC ...... *H01L 29/0847* (2013.01); *H01L 29/2003* (2013.01); *H01L 29/205* (2013.01); *H01L 29/41725* (2013.01); *H01L 29/66462* (2013.01); *H01L 29/7786* (2013.01); *H01L 41/0477* (2013.01); *H01L 41/0805* (2013.01); *H01L 41/187* (2013.01); *H01L 41/29* (2013.01); *H01L 41/314* (2013.01); *H03H 3/02* (2013.01); *H03H 9/02031* (2013.01); *H03H 9/0542* (2013.01); *H03H 9/173* (2013.01); *H03H 9/545* (2013.01); *H03H 9/562* (2013.01); *H03H 9/564* (2013.01); *H03H 2003/021* (2013.01)

(56) References Cited

U.S. PATENT DOCUMENTS

| | | | |
|---|---|---|---|
| 6,555,946 B1* | 4/2003 | Finder | H03H 9/174 |
| | | | 310/324 |
| 2002/0063497 A1* | 5/2002 | Panasik | H03H 3/02 |
| | | | 310/364 |
| 2006/0183625 A1* | 8/2006 | Miyahara | C04B 41/009 |
| | | | 501/98.4 |
| 2008/0050855 A1 | 2/2008 | Dwilinski et al. | |
| 2009/0146531 A1 | 6/2009 | Ruby et al. | |
| 2010/0163410 A1 | 7/2010 | Mastromatteo et al. | |
| 2011/0121683 A1 | 5/2011 | Milyutin et al. | |
| 2014/0227527 A1 | 8/2014 | Brors et al. | |
| 2014/0264776 A1* | 9/2014 | Thapa | H01L 29/045 |
| | | | 257/627 |
| 2014/0367777 A1* | 12/2014 | Huang | H01L 21/76877 |
| | | | 257/337 |

OTHER PUBLICATIONS

International Preliminary Report on Patentability received for PCT Application No. PCT/US2016/040762, dated Jan. 10, 2019. 7 pages.

* cited by examiner

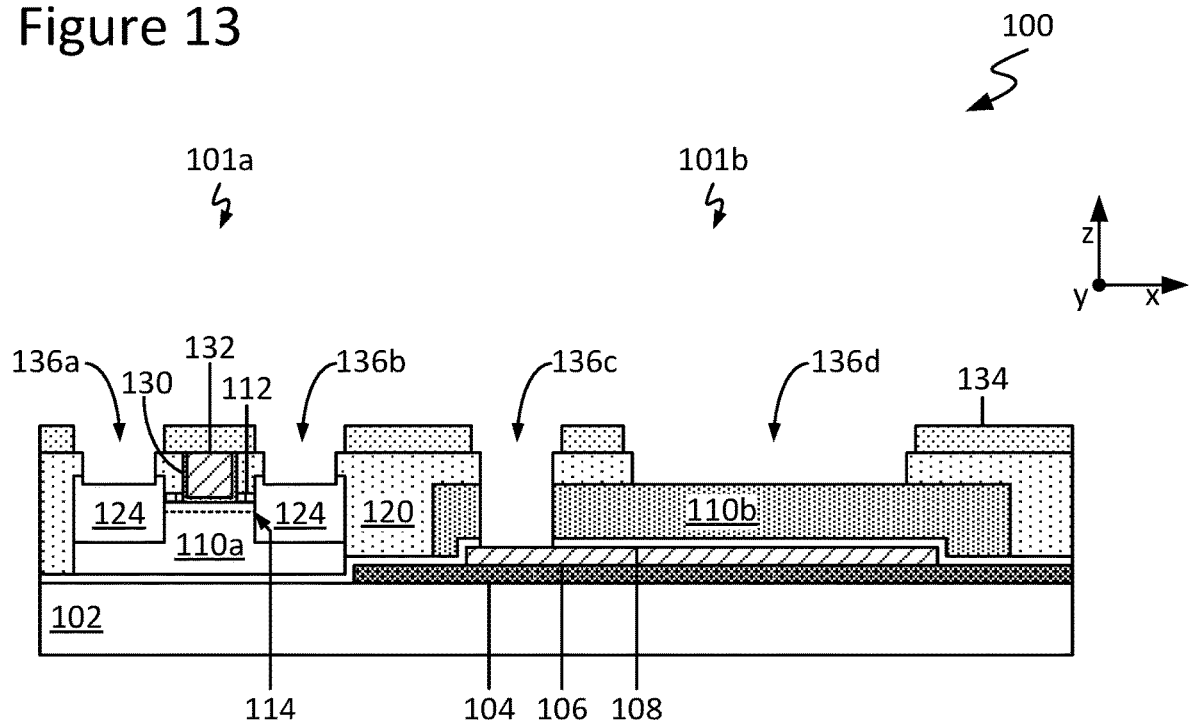
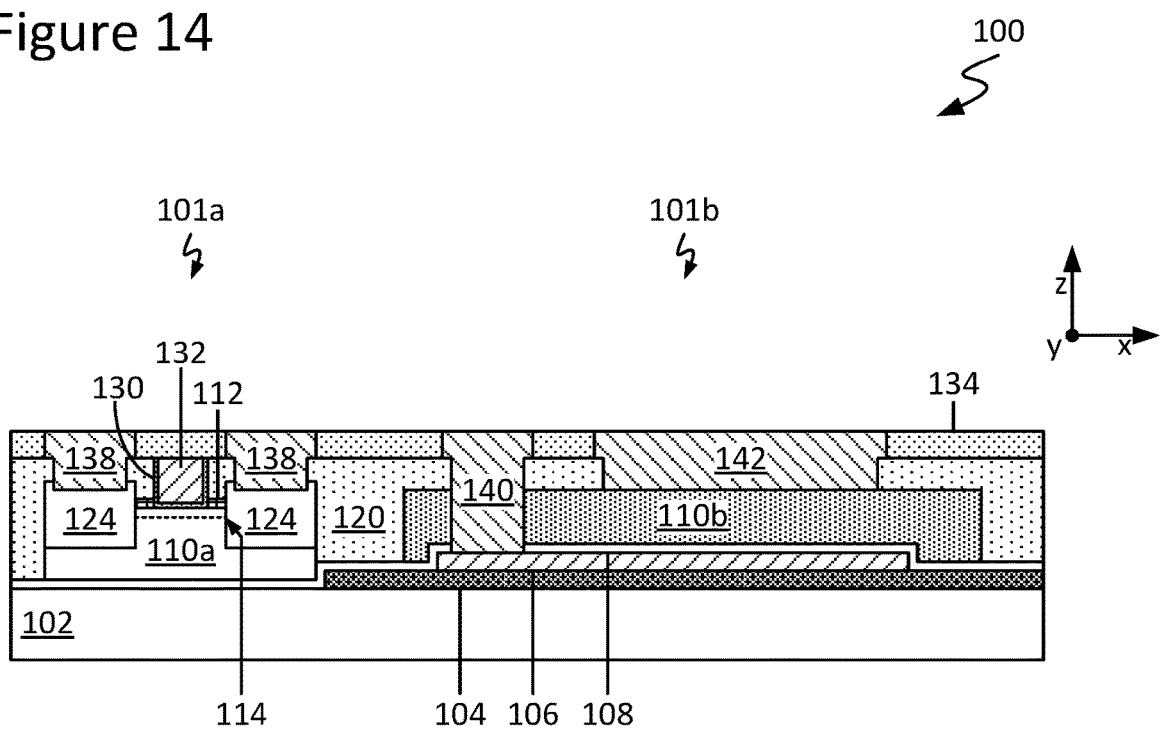

TECHNIQUES FOR MONOLITHIC CO-INTEGRATION OF POLYCRYSTALLINE THIN-FILM BULK ACOUSTIC RESONATOR DEVICES AND MONOCRYSTALLINE III-N SEMICONDUCTOR TRANSISTOR DEVICES

CROSS-REFERENCE TO RELATED APPLICATIONS

This patent application is a U.S. National Phase Application under 35 U.S.C. § 371 of International Application No. PCT/US2016/040762, filed on Jul. 1, 2016, the entire contents of which is hereby incorporated by reference herein.

BACKGROUND

With the growing number of bands and modes of communications, the quantity of radio frequency (RF) filters utilized in modern communication systems has significantly increased. Some RF filters employ thin-film bulk acoustic resonators (TFBARs, also called FBARs). Typical RF front-end technologies employing second-generation (2G), third-generation (3G), fourth-generation (4G), and long-term evolution (LTE) wireless standards utilize multiple RF filters, each with one or more constituent TFBARs.

BRIEF DESCRIPTION OF THE DRAWINGS

FIGS. 1-16 illustrate a process flow for forming an integrated circuit (IC) in accordance with an embodiment of the present disclosure.

Figure 1:
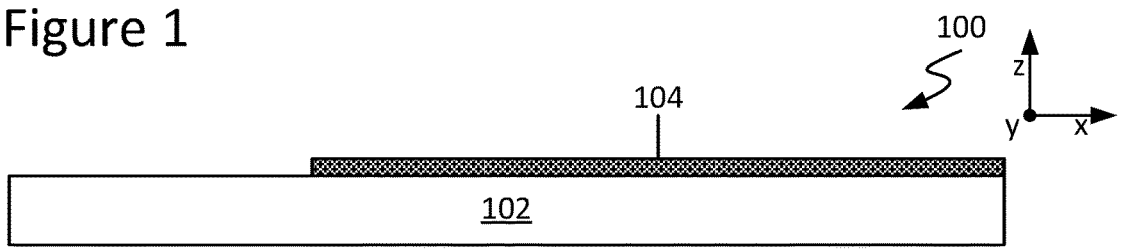

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for monolithic co-integration of thin-film bulk acoustic resonator (TFBAR, also called FBAR) devices and III-N semiconductor transistor devices. In accordance with some embodiments, one or more TFBAR devices including a polycrystalline layer of a piezoelectric III-N semiconductor material may be formed alongside one or more III-N semiconductor transistor devices including a monocrystalline layer of III-N semiconductor material, over a commonly shared semiconductor substrate. In some embodiments, either (or both) the monocrystalline and the polycrystalline layers may include gallium nitride (GaN), for example. In accordance with some embodiments, the monocrystalline and polycrystalline layers may be formed simultaneously over the shared substrate, for instance, via an epitaxial or other suitable process. This simultaneous formation may simplify the overall fabrication process, realizing cost and time savings, at least in some instances. Numerous configurations and variations will be apparent in light of this disclosure.

General Overview

The constituent thin-film bulk acoustic resonator (TFBAR, also called FBAR) devices of traditional radio frequency (RF) filters are typically fabricated on different substrates and packaged separately before deployment. Likewise, the constituent transistor devices of RF power amplifiers, switches, and low-noise amplifiers, for example, are typically fabricated and packaged in a similar manner. As such, existing fabrication techniques are not amenable to providing co-integration of these types of resonator and transistor devices on a commonly shared substrate.

Thus, and in accordance with some embodiments of the present disclosure, techniques are disclosed for monolithic co-integration of thin-film bulk acoustic resonator (TFBAR, also called FBAR) devices and III-N semiconductor transistor devices. In accordance with some embodiments, one or more TFBAR devices including a polycrystalline layer of a piezoelectric III-N semiconductor material may be formed alongside one or more III-N semiconductor transistor devices including a monocrystalline layer of III-N semiconductor material, over a commonly shared semiconductor substrate. In some embodiments, either (or both) the monocrystalline and the polycrystalline layers may include gallium nitride (GaN), for example. In accordance with some embodiments, the monocrystalline and polycrystalline layers may be formed simultaneously over the shared substrate, for instance, via an epitaxial or other suitable process. This simultaneous formation may simplify the overall fabrication process, realizing cost and time savings, at least in some instances.

In accordance with some embodiments, use of the disclosed techniques may provide for forming a TFBAR of a given target resonance frequency over a semiconductor substrate (or other semiconductor layer) shared with one or more transistor devices. As will be appreciated in light of this disclosure, close proximity of a transistor device and a TFBAR resonator provided as variously described herein may allow for integration, for example, of power amplifier circuits, RF switching circuits, and RF filtering circuits on the same semiconductor substrate and thus the same die, eliminating (or otherwise reducing) losses due to extrinsic interconnection and packaging losses. In some cases, transistor and TFBAR devices fabricated via the disclosed techniques may be utilized in RF filters and other RF devices that may be used in communication technologies that employ any one, or combination, of second-generation (2G), third-generation (3G), fourth-generation (4G), or long-term evolution (LTE) wireless standards, among others. In some instances, use of such devices may realize lower losses and higher signal integrity, from which host wireless communication platforms may benefit.

In accordance with some embodiments, structures provided as variously described herein may be configured for use, for example, in RF front-end modules in computing devices, mobile or otherwise, and various communication systems, although numerous other applications will be apparent in light of this disclosure. In accordance with some embodiments, structures provided as variously described herein may be configured for use, for example, in base stations, cellular communication towers, and the like. In accordance with some embodiments, use of the disclosed techniques may be detected, for example, by any one, or combination, of scanning electron microscopy (SEM), transmission electron microscopy (TEM), chemical composition analysis, energy-dispersive X-ray (EDX) spectroscopy, and secondary ion mass spectrometry (SIMS) of a given IC or other semiconductor structure having a III-N semiconductor transistor and a polycrystalline III-N semiconductor resonator device configured as variously described herein.

Methodology and Structure

FIGS. 1-16 illustrate a process flow for forming an IC 100 in accordance with an embodiment of the present disclosure. As can be seen from FIG. 16 in particular, this process flow may be used, for example, to fabricate an IC 100 including a III-N semiconductor transistor device 101*a* and one or more resonator devices (e.g., TFBARs) 101*b* including a polycrystalline layer of an epitaxial piezoelectric III-N semiconductor material. It should be noted that although this process flow generally depicts and explains formation of two laterally adjacent devices 101*a* and 101*b*, the present disclosure is not intended to be so limited, as in a more general sense, and in accordance with some embodiments, the disclosed techniques may be used to form any desired quantity of III-N semiconductor transistor devices and resonator devices (having any desired target resonance frequencies) in any desired arrangement over a commonly shared semiconductor substrate. In accordance with some embodiments, the disclosed techniques may be used, for example, in forming an RF filter with a plurality of resonator devices (e.g., two or more TFBAR devices), each including a III-N semiconductor layer 110*b* (discussed below) that may be of a given target thickness to achieve a given target resonance frequency (or frequencies), as desired for a given target application or end-use. In some instances, multiple resonator devices, each with a different thickness and thus different resonance frequency, may be provided.

The process flow may begin as in FIG. 1, which illustrates a cross-sectional view of an IC 100 configured in accordance with an embodiment of the present disclosure. As can be seen, IC 100 may include a semiconductor substrate 102, which may have any of a wide range of configurations. For instance, semiconductor substrate 102 may be configured as any one, or combination, of a bulk semiconductor substrate, a silicon-on-insulator (SOI) structure or other semiconductor-on-insulator structure (XOI, where X represents a semiconductor material, such as silicon, germanium, germanium-enriched silicon, and so forth), a semiconductor wafer, and a multi-layered semiconductor structure. In some instances, semiconductor substrate 102 may be configured as a silicon-on-sapphire (SOS) structure.

Semiconductor substrate 102 may be comprised of any of a wide range of semiconductor materials. For instance, in some cases, semiconductor substrate 102 may be comprised of any one, or combination, of Group IV semiconductor materials, such as silicon (Si), germanium (Ge), or silicon-germanium (SiGe). In some instances, semiconductor substrate 102 may be comprised of Si having a crystallographic orientation of (111), (110), or (100), optionally with an offcut towards (110) in the range of about 1-10° (e.g., about 1-4°, about 4-7°, about 7-10°, or any other sub-range in the range of about 1-10°. In some other cases, semiconductor substrate 102 may be comprised of any one, or combination, of Group III-V compound semiconductor materials, such as gallium arsenide (GaAs) or indium phosphide (InP), among others. In some still other cases, semiconductor substrate 102 may be comprised of silicon carbide (SiC) or sapphire (α-Al$_2$O$_3$). In some instances, the particular material composition of semiconductor substrate 102 may be chosen, at least in part, based on a target electrical resistivity range suitable for a given transistor device 101*a* and/or resonator device 101*b* formed there over, as described herein. In some cases, semiconductor substrate 102 may have an electrical resistivity of about 1,000 Ω·cm or greater (e.g., about 1,200 Ω·cm or greater, about 1,500 Ω·cm or greater, and so forth).

It should be noted that semiconductor substrate 102 is not intended to be limited only to configurations and implementations as a substrate for a given host architecture, as in accordance with some other embodiments, semiconductor substrate 102 may be configured or otherwise implemented as an intermediate layer disposed in a given host architecture. Other suitable materials, configurations, and resistivity ranges for semiconductor substrate 102 will depend on a given application and will be apparent in light of this disclosure.

Also, as can be seen from FIG. 1, a dielectric layer 104 may be disposed over a topography provided, in part or in whole, by semiconductor substrate 102. Dielectric layer 104 may be comprised of any one, or combination, of a wide range of dielectric materials. For instance, in some embodiments, dielectric layer 104 may be comprised of an oxide, such as silicon dioxide (SiO$_2$) or aluminum oxide (Al$_2$O$_3$), a nitride, such as silicon nitride (Si$_3$N$_4$), or an oxynitride, such as silicon oxynitride (SiON). Dielectric layer 104 may be formed via any suitable standard, custom, or proprietary technique(s), as will be apparent in light of this disclosure. In accordance with some embodiments, dielectric layer 104 may be formed via any one, or combination, of a physical vapor deposition (PVD) process, such as sputter deposition, a chemical vapor deposition (CVD) process, such as plasma-enhanced CVD (PECVD), and an atomic layer deposition (ALD) process, to name a few. The thickness (e.g., x-thickness in the x-direction; z-thickness in the z-direction) of dielectric layer 104 may be customized, as desired for a given target application or end-use. In some cases, dielectric layer 104 may have a z-thickness in the range of about 50-500 nm (e.g., about 50-250 nm, about 250-500 nm, or any other sub-range in the range of about 50-500 nm). At least in some cases, dielectric layer 104 may be configured to serve as a sort of sacrificial layer utilized in the process of forming cavity 146 (discussed below). Other suitable materials, formation techniques, configurations, and dimensions for dielectric layer 104 will depend on a given application and will be apparent in light of this disclosure.

Figure 2:
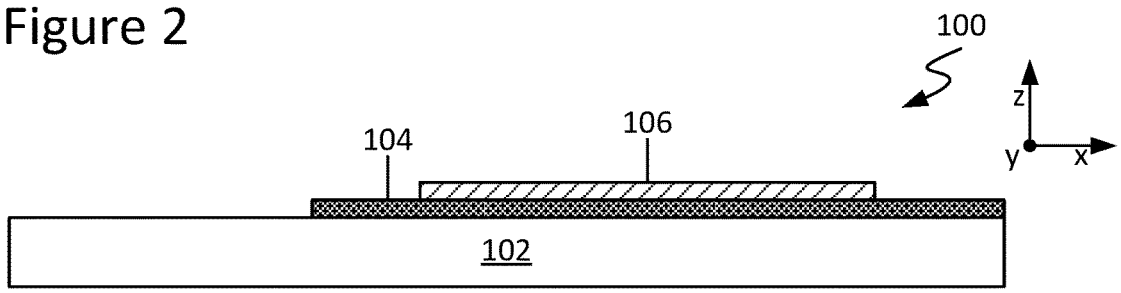

The process flow may continue as in FIG. 2, which illustrates a cross-sectional view of the IC 100 of FIG. 1 after forming an electrode layer 106, in accordance with an embodiment of the present disclosure. Electrode layer 106 may be disposed over a topography provided, in part or in whole, by dielectric layer 104. Electrode layer 106 may be comprised of any of a wide range of suitable electrically conductive materials. For instance, in some cases, electrode layer 106 may be comprised of any one, or combination, of electrically conductive refractory materials, such as tungsten (W), molybdenum (Mo), tantalum nitride (TaN), titanium nitride (TiN), or an alloy of any thereof, to name a few. Electrode layer 106 may be formed via any suitable standard, custom, or proprietary techniques, as will be apparent in light of this disclosure. In accordance with some embodiments, electrode layer 106 may be formed via any one, or combination, of a PVD process (e.g., sputter deposition), a CVD process, and an ALD process, among others. The dimensions (e.g., z-thickness in the z-direction) of electrode layer 106 may be customized, as desired for a given target application or end-use. In some cases, electrode layer 106 may have a z-thickness in the range of about 200 nm or less (e.g., about 150 nm or less, about 100 nm or less, about 50 nm or less, or any other sub-range in the range of about 200 nm or less). Other suitable materials, formation techniques, and dimensions for electrode layer 106 will depend on a given application and will be apparent in light of this disclosure.

Figure 3:
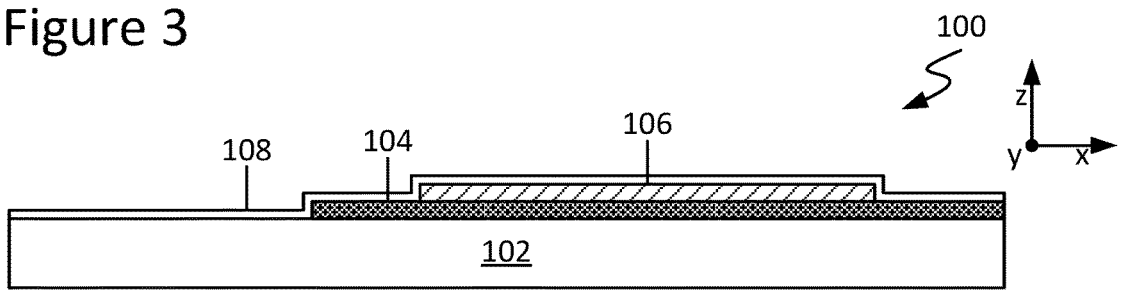

The process flow may continue as in FIG. 3, which illustrates a cross-sectional view of the IC 100 of FIG. 2 after forming a nucleation layer 108, in accordance with an embodiment of the present disclosure. Nucleation layer 108 (or other buffer layer) may be disposed, in part or in whole, over a topography provided by semiconductor substrate 102, dielectric layer 104, and electrode layer 106. Nucleation layer 108 may be comprised of any one, or combination, of suitable nucleation materials, such as, for example, aluminum nitride (AlN), aluminum gallium nitride (AlGaN), or an alloy of any thereof, to name a few. Nucleation layer 108 may be formed via any suitable standard, custom, or proprietary technique(s), as will be apparent in light of this disclosure. For instance, in accordance with some embodiments, nucleation layer 108 may be formed via any one, or combination, of a molecular beam epitaxy (MBE) process and a metalorganic vapor phase epitaxy (MOVPE) process, among others. Moreover, the dimensions (e.g., x-width in the x-direction; z-thickness in the z-direction) of nucleation layer 108 may be customized, as desired for a given target application or end-use. In some cases, nucleation layer 108 may have a z-thickness in the range of about 50-200 nm (e.g., about 50-125 nm, about 125-200 nm, or any other sub-range in the range of about 50-200 nm). Other suitable materials, formation techniques, and dimensions for nucleation layer 108 will depend on a given application and will be apparent in light of this disclosure.

Figure 4:
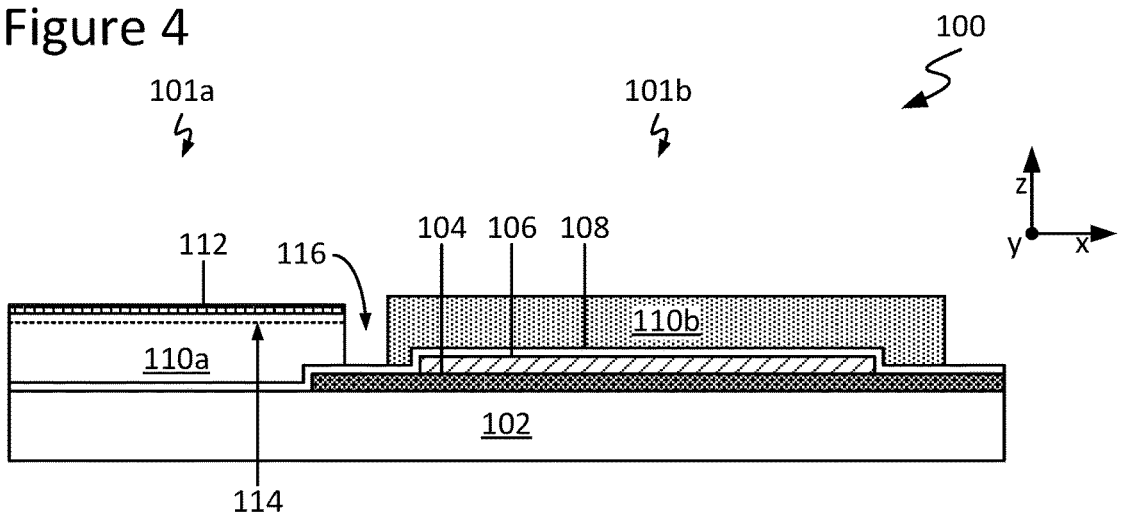

The process flow may continue as in FIG. 4, which illustrates a cross-sectional view of the IC 100 of FIG. 3 after forming a III-N semiconductor layer 110a and polarization layer 112 for transistor device 101a and a III-N semiconductor layer 110b for resonator device 101b, in accordance with an embodiment of the present disclosure. Each of III-N semiconductor layers 110a and 110b may be disposed over a topography provided, in part or in whole by nucleation layer 108. More particularly, III-N semiconductor layer 110b may be disposed over a portion of semiconductor substrate 102 where electrode layer 106 generally resides, whereas III-N semiconductor layer 110a may be disposed over a different portion of semiconductor substrate 102, at least in some embodiments. A given III-N semiconductor layer 110a, 110b may be comprised of any one, or combination, of III-N semiconductor materials, including gallium nitride (GaN), aluminum nitride (A1N), indium nitride (InN), indium gallium nitride (InGaN), aluminum gallium nitride (AlGaN), aluminum indium nitride (AlInN), and aluminum indium gallium nitride (AlInGaN). In some embodiments, a given III-N semiconductor layer 110a, 110b may be configured as a single-layer structure, whereas in some other embodiments, it may be configured as a bi-layer, tri-layer, or other multi-layer structure. In some embodiments, a given III-N semiconductor layer 110a, 110b may include one or more three-dimensional semiconductor structures, such as island-like semiconductor bodies or nanowire or nanoribbon semiconductor bodies, to name a few.

A given III-N semiconductor layer 110a, 110b may be formed via any suitable standard, custom, or proprietary technique(s), as will be apparent in light of this disclosure. For instance, in accordance with some embodiments, a given III-N semiconductor layer 110a, 110b may be formed via any one, or combination, of a CVD process, such as metal-organic CVD (MOCVD), and an epitaxy process (e.g., MOVPE; MBE), among others. In accordance with some embodiments, III-N semiconductor layers 110a and 110b may be formed simultaneously over nucleation layer 108, whereas in accordance with other embodiments, they may be formed separately (e.g., first one, then the other, in a given desired order).

The dimensions (e.g., z-thickness in the z-direction) of a given III-N semiconductor layer 110a, 110b may be customized, as desired for a given target application or end-use. In some cases, a given III-N semiconductor layer 110a, 110b may have a z-thickness in the range of about 3 µm or less (e.g., about 2 µm or less, about 1 µm or less, about 0.5 µm or less, or any other sub-range in the range of about 3 µm or less). In some instances, a given III-N semiconductor layer 110a, 110b may have a first portion having a z-thickness in the range of about 1-3 µm (e.g., about 1-2 µm, about 2-3 µm, or any other sub-range in the range of about 1-3 µm) and a second portion having a z-thickness in the range of about 50-500 nm (e.g., about 50-275 nm, about 275-500 nm, or any other sub-range in the range of about 50-500 nm). Other suitable materials, formation techniques, configurations, and dimensions for III-N semiconductor layers 110a, 110b will depend on a given application and will be apparent in light of this disclosure.

In forming III-N semiconductor layer 110a over nucleation layer 108 at a location in which semiconductor substrate 102 is disposed beneath nucleation layer 108, the resultant III-N semiconductor layer 110a may be monocrystalline, at least in some instances. In a specific example case, if semiconductor substrate 102 is comprised of Si, and nucleation layer 108 is comprised of AlN, then III-N semiconductor layer 110a formed there over may be monocrystalline.

In forming III-N semiconductor layer 110b over nucleation layer 108 at a location in which one or more layers (e.g., dielectric layer 104; electrode layer 106) intervene between semiconductor substrate 102 and nucleation layer 108, the resultant III-N semiconductor layer 110b may be polycrystalline, at least in some instances. In a specific example case, if semiconductor substrate 102 is comprised of Si, and nucleation layer 108 is comprised of AlN, then III-N semiconductor layer 110b formed over either (or both) of dielectric layer 104 and electrode layer 106 may be polycrystalline.

As can be seen from FIG. 4, polarization layer 112 may be disposed over a topography provided, in part or in whole, by III-N semiconductor layer 110a and, optionally, over a topography provided, in part or in whole, by III-N semiconductor layer 110b, in accordance with some embodiments. Polarization layer 112 may be provided with any of the example materials and formation techniques discussed above, for instance, with respect to III-N semiconductor layers 110a, 110b, in accordance with some embodiments. In some embodiments, polarization layer 112 may be comprised of $Al_xIn_{1-x}N$, where x is in the range of about 0.7-0.99. In a specific example such case, x=0.83, and thus polarization layer 112 may be an $Al_{0.83}In_{0.17}N$ layer. At x=0.83, there may be no (or otherwise negligible) lattice mismatch between such a polarization layer 112 and underlying III-N semiconductor layer 110a. In some other embodiments, polarization layer 112 may be comprised of $Al_xGa_{1-x}N$, where x is in the range of about 0.05-0.5. In a specific example such case, x=0.1, and thus polarization layer 112 may be an $Al_{0.1}Ga_{0.9}N$ layer. In another specific example such case, x=0.4, and thus polarization layer 112 may be an $Al_{0.4}Ga_{0.6}N$ layer. In some still other embodiments, polarization layer 112 may be comprised of $Al_xIn_yGa_{1-x-y}N$, where x is in the range of about 0.01-0.9 and y is in the range of about 0.01-0.1. In a specific example such case, x=0.05 and y=0.05, and thus polarization layer 112 may be an $Al_{0.05}In_{0.05}Ga_{0.9}N$ layer. In another specific example such case, x=0.1 and y=0.1, and thus polarization layer 112 may be an $Al_{0.1}In_{0.1}Ga_{0.8}N$ layer. In yet another specific example such case, x=0.85 and y=0.05, and thus polarization layer 112 may be an $Al_{0.85}In_{0.05}Ga_{0.1}N$ layer.

Moreover, the dimensions (e.g., z-thickness in the z-direction) of polarization layer 112 may be customized, as desired for a given target application or end-use. In some cases, polarization layer 112 may have a z-thickness in the range of about 1-50 nm (e.g., about 1-25 nm, about 25-50 nm, or any other sub-range in the range of about 1-50 nm). In accordance with some embodiments, polarization layer 112 may serve to induce a two-dimensional electron gas (2DEG) layer 114 in underlying III-N semiconductor layer 110a (e.g., for use as a channel therein). If optionally disposed over III-N semiconductor layer 110b as well, polarization layer 112 likewise may serve to induce a 2DEG layer 114 therein (e.g., for use as an electrode or other electrically conductive element therein). Other suitable materials, formation techniques, and dimensions for polarization layer 112 will depend on a given application and will be apparent in light of this disclosure.

As can be seen further from FIG. 4, III-N semiconductor layers 110a and 110b may be formed laterally adjacent one another, separated by a gap feature 116 there between, in accordance with some embodiments. The initial dimensions and geometry of gap feature 116 may be customized, as desired for a given target application or end-use, and may depend, at least in part, on the particular formation techniques employed and underlying layers of IC 100.

Figure 5:
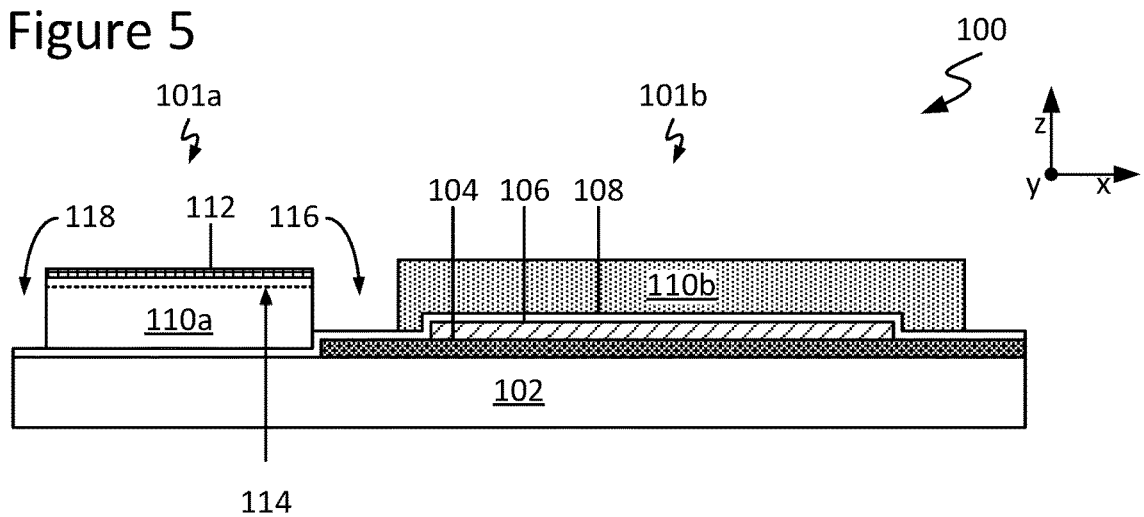

The process flow may continue as in FIG. 5, which illustrates a cross-sectional view of the IC 100 of FIG. 4 after partially removing III-N semiconductor layer 110a and polarization layer 112 from transistor device 101a, in accordance with an embodiment of the present disclosure. As can be seen, in partially removing material from III-N semiconductor layer 110a and polarization layer 112, gap feature 116 may be modified in dimensions and/or geometry, and another feature 118 may be formed over semiconductor substrate 102, the dimensions and geometry of which may be customized, as desired for a given target application or end-use. In this manner, a first stacked arrangement (e.g., a first mesa portion) including III-N semiconductor layer 110a and polarization layer 112 (which may induce a 2DEG layer 114 for transistor device 101a) may remain over a first portion of semiconductor substrate 102 generally corresponding to the area of formation of transistor device 101a, in accordance with some embodiments.

A given feature 116, 118 may be, for example, a trench, via-hole, or other opening or recess that extends through a full thickness (e.g., z-thickness in the z-direction) of polarization layer 112 and III-N semiconductor layer 110a, landing on underlying nucleation layer 108. A given feature 116, 118 may be formed via any suitable standard, custom, or proprietary lithography, etch, and clean technique(s), as will be apparent in light of this disclosure. In accordance with some embodiments, a given feature 116, 118 may be formed via any one, or combination, of a dry etch process and a wet etch process, the etch chemistry of which may be customized, as desired for a given target application or end-use. In some cases, a dry plasma etching process utilizing a gas mixture of argon (Ar) and chlorine (Cl) may be employed. As can be seen further from FIG. 5, at least in some cases, III-N semiconductor layer 110a and polarization layer 112 may be partially removed such that any portions previously extending over electrode layer 104 no longer do so (or do so only in a negligible manner). Other suitable formation techniques, configurations, and dimensions for features 116, 118 will depend on a given application and will be apparent in light of this disclosure.

Figure 6:
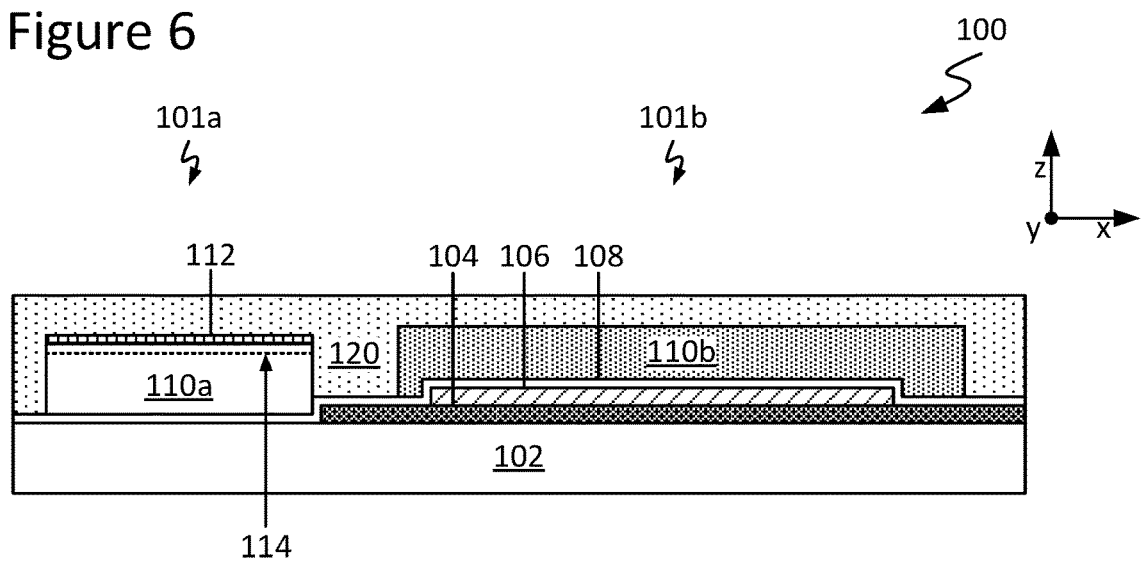

The process flow may continue as in FIG. 6, which illustrates a cross-sectional view of the IC 100 of FIG. 5 after forming a dielectric layer 120, in accordance with an embodiment of the present disclosure. Dielectric layer 120 may be disposed over a topography provided, in part or in whole, by nucleation layer 108, III-N semiconductor layer 110a, III-N semiconductor layer 110b, and polarization layer 112. Dielectric layer 120 may be comprised of any one, or combination, of a wide range of dielectric materials. For instance, in some embodiments, dielectric layer 120 may be comprised of an oxide, such as silicon oxide ($SiO_2$), aluminum oxide ($Al_2O_3$), hafnium oxide ($HfO_2$), zirconium oxide ($ZrO_2$), tantalum oxide ($Ta_2O_5$), titanium oxide ($TiO_2$), lanthanum oxide ($La_2O_3$), or carbon (C)-doped oxide (CDO), among others. In some embodiments, dielectric layer 120 may be comprised of a nitride, such as silicon mononitride (SiN) or silicon nitride ($Si_3N_4$), or an oxynitride, such as silicon oxynitride (SiON) or C-doped SiON, a carbide, such as silicon carbide (SiC), or an oxycarbonitride, such as silicon oxycarbonitride (SiOCN), among others. In some embodiments, dielectric layer 120 may be comprised of an organosilicate glass (SiCOH). In some embodiments, dielectric layer 120 may be comprised of an inorganic compound, such as hydrogen silsesquioxane (HSQ).

Dielectric layer 120 may be formed via any suitable standard, custom, or proprietary technique(s), as will be apparent in light of this disclosure. In accordance with some embodiments, dielectric layer 120 may be formed via any one, or combination, of a PVD process (e.g., sputter deposition), a spin-on deposition (SOD) process, a CVD process (e.g., PECVD), and an ALD process, to name a few. The thickness (e.g., x-thickness in the x-direction; z-thickness in the z-direction) of dielectric layer 120 may be customized, as desired for a given target application or end-use. In some cases, dielectric layer 120 may have a z-thickness, for example, sufficient to fill a given feature 116, 118 and extend above either (or both) of III-N semiconductor layer 110a and 110b. Any overburden of dielectric layer 120 may be removed, for example, via a chemical-mechanical planarization (CMP) process or other suitable planarization process. In accordance with some embodiments, dielectric layer 120 may be configured to serve as a shallow trench isolation (STI) layer for IC 100. Other suitable materials, formation techniques, configurations, and dimensions for dielectric layer 120 will depend on a given application and will be apparent in light of this disclosure.

Figure 7:
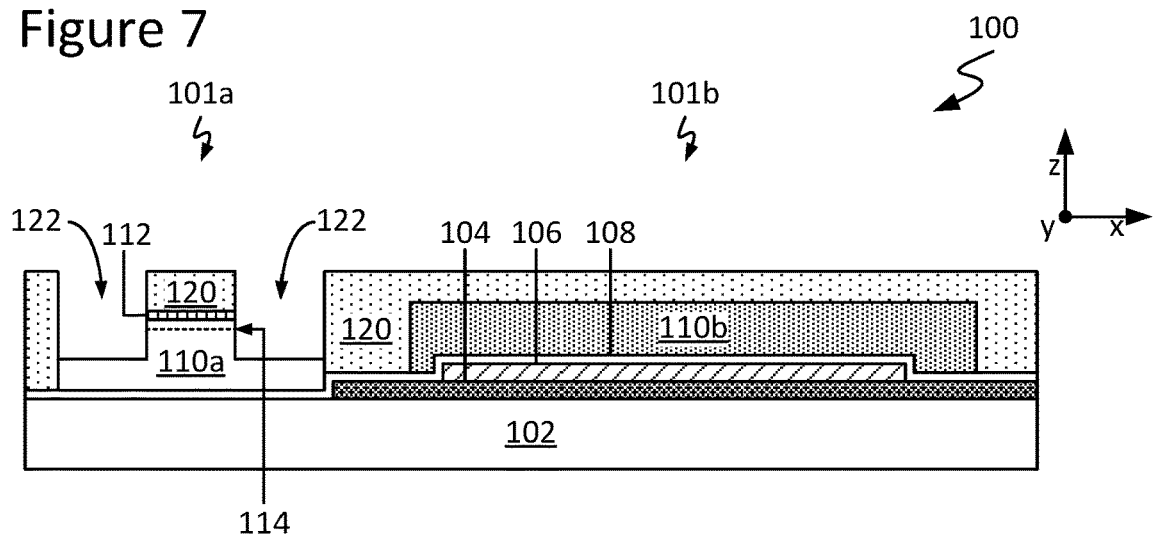

The process flow may continue as in FIG. 7, which illustrates a cross-sectional view of the IC 100 of FIG. 6 after patterning with one or more features 122, in accordance with an embodiment of the present disclosure. A given feature 122 may be, for example, a trench, via-hole, or other opening or recess that extends through a full thickness (e.g., z-thickness in the z-direction) of polarization layer 112 and into at least a partial thickness (e.g., z-thickness in the z-direction) of III-N semiconductor layer 110a. A given feature 122 may be formed via any suitable standard, custom, or proprietary lithography, etch, and clean technique (s), as will be apparent in light of this disclosure. In accordance with some embodiments, a given feature 122 may be formed via any one, or combination, of a dry etch process and a wet etch process, the etch chemistry of which may be customized, as desired for a given target application or end-use. The dimensions (e.g., x-width in the x-direction; z-depth in the z-direction) and geometry of a given feature 122 may be customized, as desired for a given target application or end-use. In accordance with some embodiments, a given feature 122 may be configured to host a given source/drain (S/D) portion 124 (discussed below). Other suitable formation techniques, configurations, and dimensions for feature(s) 122 will depend on a given application and will be apparent in light of this disclosure.

Figure 8:
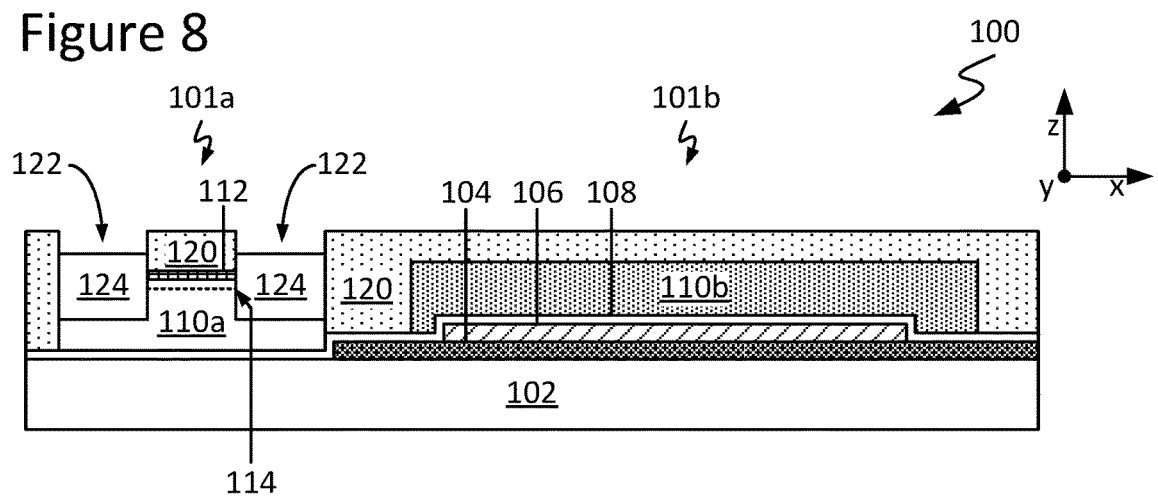

The process flow may continue as in FIG. 8, which illustrates a cross-sectional view of the IC 100 of FIG. 7 after forming S/D portions 124 for transistor device 101a, in accordance with an embodiment of the present disclosure. A given S/D portion 124 may be disposed within a given feature 122, over a topography provided, in part or in whole, by III-N semiconductor layer 110a, polarization layer 112, and dielectric layer 120. As can be seen generally from FIG. 7, a given S/D portion 124 may be disposed over a region of III-N semiconductor layer 110a, adjacent polarization layer 112 and 2DEG layer 114 of transistor device 101a.

A given S/D portion 124 may be comprised of any of a wide range of suitable S/D material(s). For instance, in accordance with some embodiments, a given S/D portion 124 may be comprised of any one, or combination, of GaN, InGaN, and InN, to name a few. In an example case, a given S/D portion 124 may be comprised of $In_{0.05}Ga_{0.95}N$. In another example case, a given S/D portion 124 may be comprised of $In_{0.15}Ga_{0.85}N$. In accordance with some embodiments, a given S/D portion 124 may be doped, at least in part, with an n-type dopant, such as silicon (Si) or germanium (Ge), thereby providing n-type S/D portion(s) for transistor device 101a. The particular dopant type and concentration, as well as the doping profile (e.g., dopant gradient or other variation, if any) may be customized, as desired for a given target application or end-use. In some cases, a given S/D portion 124 may be a highly n-doped (e.g., $n^+$) layer. A given S/D portion 124 may be formed via any suitable standard, custom, or proprietary technique(s), as will be apparent in light of this disclosure. In accordance with some embodiments, a given S/D portion 124 may be formed via any one, or combination, of a CVD process (e.g., an MOCVD process) and an epitaxial process (e.g., an MBE process). Moreover, the dimensions (e.g., x-width in the x-direction; z-height in the z-direction) of a given S/D portion 124 may be customized, as desired for a given target application or end-use. In some cases, a given S/D portion 124 may have a z-height sufficient to at least partially fill a given host feature 122, for instance, to a given target height along sidewalls of any one, or combination, of III-N semiconductor layer 110a, polarization layer 112, and dielectric layer 120. Other suitable materials, doping schemes, formation techniques, configurations, and dimensions for S/D portions 124 will depend on a given application and will be apparent in light of this disclosure.

Figure 9:
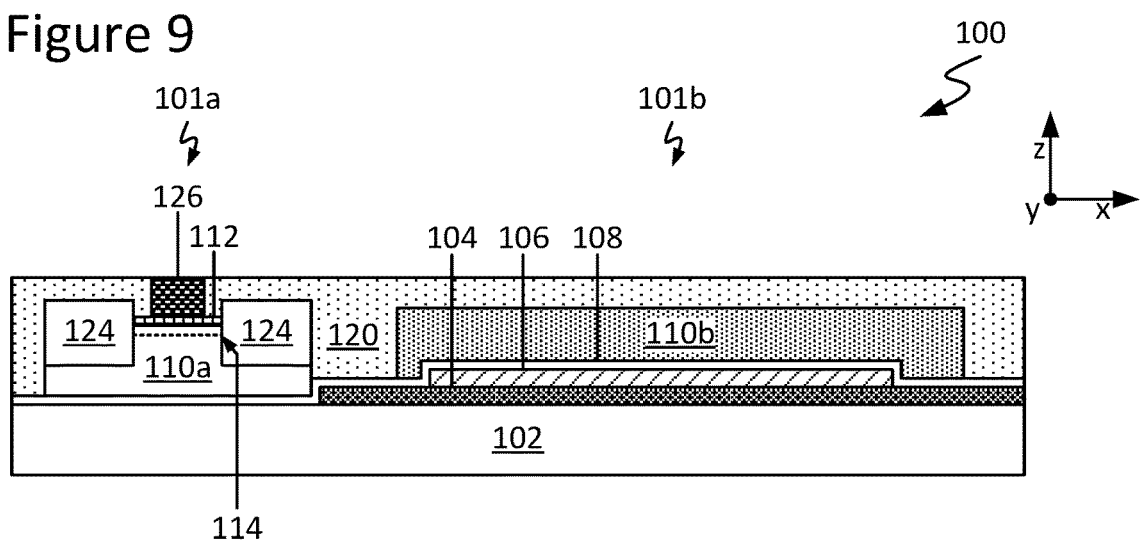

The process flow may continue as in FIG. 9, which illustrates a cross-sectional view of the IC 100 of FIG. 8 after forming a dummy gate layer 126 and further forming dielectric layer 120, in accordance with an embodiment of the present disclosure. Dummy gate layer 126 may be disposed over a topography provided, in part or in whole, by polarization layer 112. In accordance with some embodiments, dummy gate layer 126 may be configured as a replacement metal gate (RMG) process layer including one or more dummy gate dielectric layers and/or one or more RMG process gates disposed there over. In accordance with some embodiments, a RMG process gate of dummy gate layer 126 may be comprised of any one, or combination, of suitable materials, such as polycrystalline or amorphous silicon (Si) or a nitride, such as silicon nitride ($Si_3N_4$), to name a few.

Dummy gate layer 126 may be formed via any suitable standard, custom, or proprietary technique(s), as will be apparent in light of this disclosure. In accordance with some embodiments, dummy gate layer 126 may be formed via any one, or combination, of a PVD process (e.g., sputter deposition) and a CVD process. The dimensions (e.g., z-height in the z-direction) of dummy gate layer 126 may be customized, as desired for a given target application or end-use. Other suitable materials, formation techniques, configurations, and dimensions for dummy gate layer 126 will depend on a given application and will be apparent in light of this disclosure.

After forming dummy gate layer 126, further formation of dielectric layer 120 may be provided via any of the example techniques discussed above, for instance, with respect to forming dielectric layer 120 (e.g., in the context of FIG. 6), in accordance with some embodiments. Any overburden of dielectric layer 120 may be removed, for example, via a CMP process or other suitable planarization process. As will be appreciated in light of this disclosure, dummy gate layer 126 may serve as a stop point in overburden removal, and thus a surface of dummy gate layer 126 may be substantially co-planar with a surface of dielectric layer 120 (e.g., as generally can be seen in FIG. 9), at least in some instances.

Figure 10:
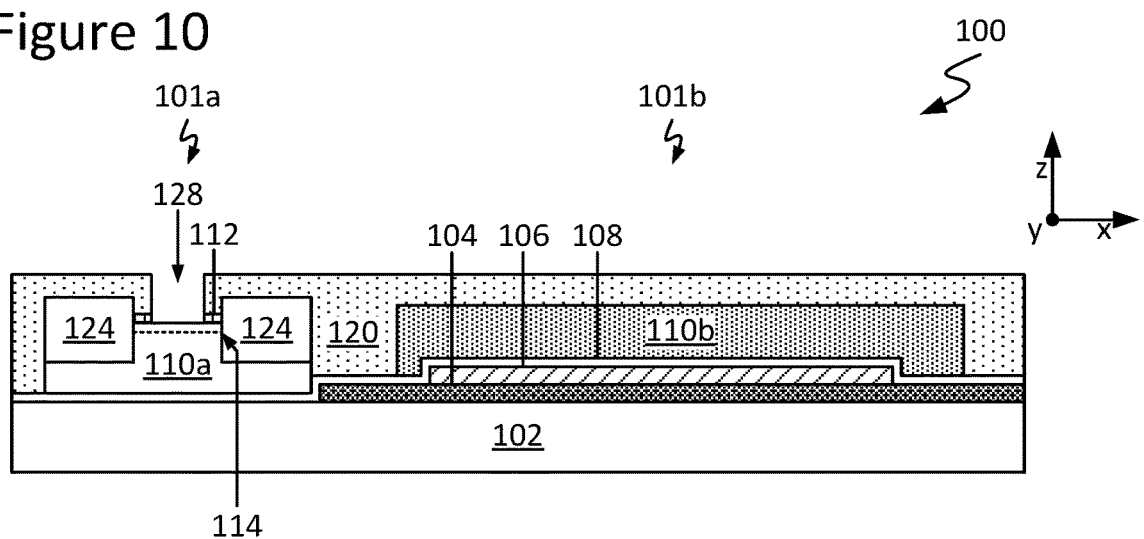

The process flow may continue as in FIG. 10, which illustrates a cross-sectional view of the IC 100 of FIG. 9 after patterning with a feature 128, in accordance with an embodiment of the present disclosure. Feature 128 may be, for example, a trench, via-hole, or other opening or recess that extends through at least a partial thickness (e.g., z-thickness in the z-direction) of dielectric layer 120 and a full thickness (e.g., z-thickness in the z-direction) of polarization layer 112, landing on III-N semiconductor layer 110a. In forming feature 128, partial removal of dielectric layer 120 and polarization layer 112 may be provided via any standard, custom, or proprietary lithography, etch, and clean processes, as will be apparent in light of this disclosure. In some cases, III-N semiconductor layer 110a may serve, at least in part, as a stop point in forming feature 128. Moreover, the particular dimensions and geometry of feature 128 may be customized, as desired for a given target application or end-use. In accordance with some embodiments, feature 128 may be configured to host a gate dielectric layer 130 and a gate layer 132 (each discussed below). Other suitable formation techniques, configurations, and dimensions for feature 128 will depend on a given application and will be apparent in light of this disclosure.

Figure 11:
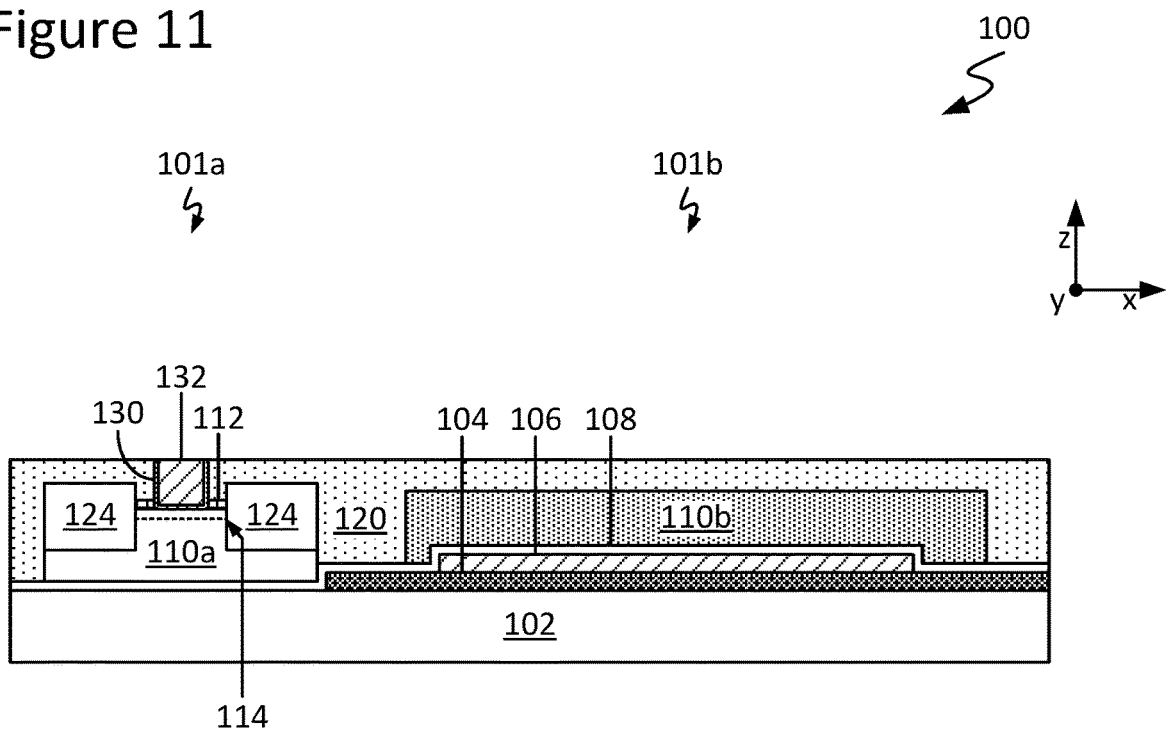

The process flow may continue as in FIG. 11, which illustrates a cross-sectional view of the IC 100 of FIG. 10 after forming a gate dielectric layer 130 and a gate layer 132, in accordance with an embodiment of the present disclosure. Gate dielectric layer 130 may be disposed within feature 128, over a topography provided, in part or in whole, by III-N semiconductor layer 110a, polarization layer 112, and dielectric layer 120. Gate dielectric layer 130 may be comprised of any of a wide range of suitable high-K dielectric materials. For instance, in some embodiments, gate dielectric layer 130 may be comprised of any one, or combination, of aluminum oxide ($Al_2O_3$), hafnium oxide ($HfO_2$), silicon dioxide ($SiO_2$), silicon nitride ($Si_3N_4$), and zirconium dioxide ($ZrO_2$), to name a few. Gate dielectric layer 130 may be formed via any suitable standard, custom, or proprietary technique(s), as will be apparent in light of this disclosure. In accordance with some embodiments, gate dielectric layer 130 may be formed via any one, or combination, of a PVD process (e.g., sputter deposition) and a CVD process. Moreover, the dimensions (e.g., x-thickness in the x-direction; z-thickness in the z-direction) of gate dielectric layer 130 may be customized, as desired for a given target application or end-use. In some cases, gate dielectric layer 130 may have an x-thickness and/or z-thickness in the range of about 1-200 nm (e.g., about 1-100 nm, about 100-200 nm, or any other sub-range in the range of about 1-200 nm).

Gate layer 132 may be disposed within feature 128, over a topography provided, in part or in whole, by gate dielectric layer 130. Gate layer 132 may be comprised of any one, or combination, of suitable metals or metal nitrides, such as tungsten (W), copper (Cu), aluminum (Al), titanium (Ti), titanium nitride (TiN), or an alloy of any thereof, to name a few. Gate layer 132 may be formed via any of the example formation techniques discussed above, for instance, with respect to gate dielectric layer 130, in accordance with some embodiments. Moreover, the dimensions (e.g., x-width in the x-direction; z-height in the z-direction) of gate layer 132 may be customized, as desired for a given target application or end-use. In some cases, gate layer 132 may have a z-height, for example, sufficient to fill host feature 128. Any overburden of gate dielectric layer 130 and gate layer 132 may be removed, for example, via a CMP process or other suitable planarization process. Other suitable materials, formation techniques, configurations, and dimensions for gate dielectric layer 130 and gate layer 132 will depend on a given application and will be apparent in light of this disclosure.

Figure 12:
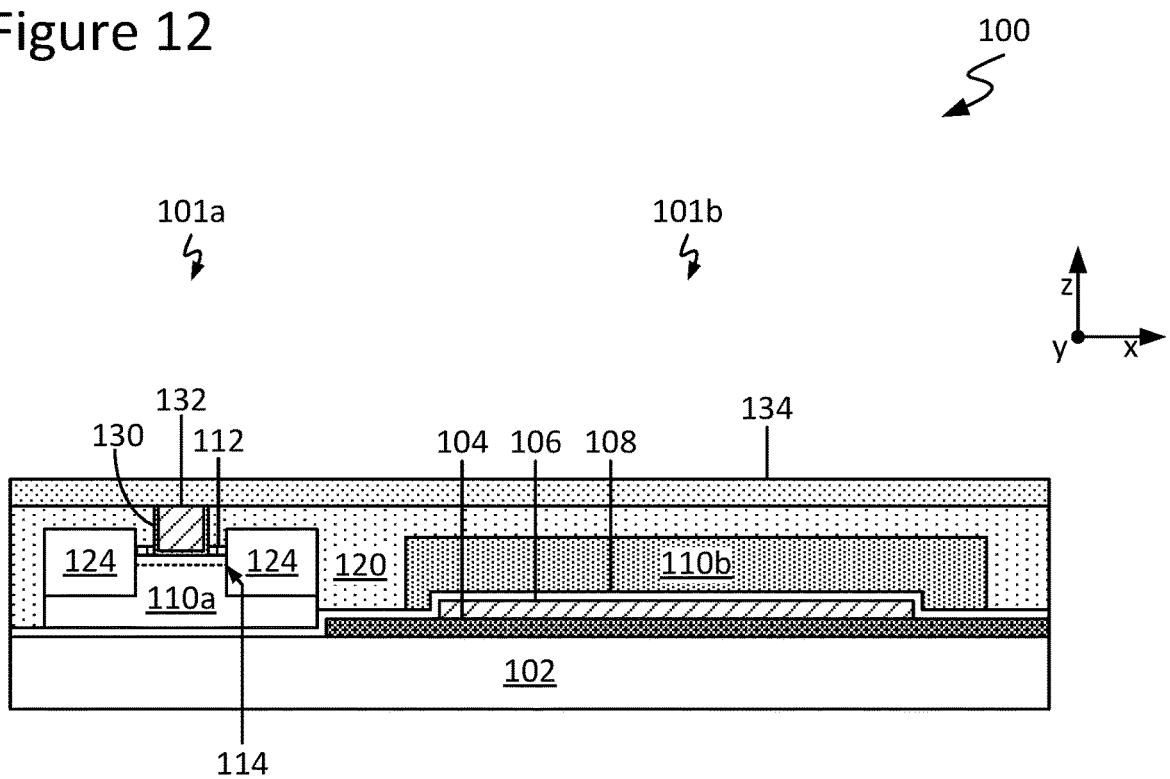

The process flow may continue as in FIG. 12, which illustrates a cross-sectional view of the IC 100 of FIG. 11 after forming a dielectric layer 134, in accordance with an embodiment of the present disclosure. As can be seen, dielectric layer 134 may be disposed over a topography provided, in part or in whole, by dielectric layer 120, gate dielectric layer 130, and gate layer 132. Dielectric layer 134 may be provided with any of the example materials, formation techniques, and dimensions discussed above, for instance, with respect to dielectric layer 120, in accordance with some embodiments. In some cases, dielectric layer 134 and dielectric layer 120 may differ in material composition, whereas in other cases, they may be of the same material composition. In some cases, dielectric layer 134 may be configured to serve, at least in part, as an inter-layer dielectric (ILD) for IC 100. Other suitable materials, formation techniques, and dimensions for dielectric layer 134 will depend on a given application and will be apparent in light of this disclosure.

The process flow may continue as in FIG. 13, which illustrates a cross-sectional view of the IC 100 of FIG. 12 after patterning with features 136a-136d, in accordance with an embodiment of the present disclosure. Each of features 136a-136d may be, for example, a trench, via-hole, or other opening or recess. As can be seen, each of a first feature 136a and a second feature 136b may extend through a full thickness of dielectric layer 134 and a partial thickness of dielectric layer 120, landing on and extending into a given underlying S/D portion 124. A third feature 136c may extend through a full thickness of dielectric layer 134, a partial thickness of dielectric layer 120, a full thickness of III-N semiconductor layer 110b, and a full thickness of nucleation layer 108, landing on electrode layer 106. A fourth feature 136d may extend through a full thickness of dielectric layer 134 and a partial thickness of dielectric layer 120, landing on III-N semiconductor layer 110b. Thus, as can be seen generally from FIG. 13, feature 136c may be of greater z-depth than one or more of features 136a, 136b, and 136d, in accordance with some embodiments.

In forming a given feature 136a-136d, partial removal of any of dielectric layer 134, dielectric layer 120, S/D portions 124, III-N semiconductor layer 110b, and nucleation layer 108 may be provided via any standard, custom, or proprietary lithography, etch, and clean processes, as will be apparent in light of this disclosure. In accordance with some embodiments, feature 136c may be formed first, and any (or all) of features 136a, 136b, and 136d may be formed subsequently. To this end, a first masking layer may be employed in forming feature 136c, and a second masking layer may be employed in forming features 136a, 136b, and 136d. A given masking layer may be comprised of any suitable standard, custom, or proprietary masking material, as will be apparent in light of this disclosure. In some cases, the first and second masking layers may differ in material composition, whereas in other cases, they may be of the same material composition.

The particular dimensions (e.g., x-width in the x-direction; z-depth in the z-direction) and geometry of each of features 136a-136d may be customized, as desired for a given target application or end-use. In accordance with some embodiments, each of features 136a and 136b may be configured to host a S/D contact 138 (discussed below). In accordance with some embodiments, feature 136c may be configured to host electrode contact 140 (discussed below). In accordance with some embodiments, feature 136d may be configured to host electrode layer 142 (discussed below). Other suitable formation techniques, configurations, and dimensions for features 136a-136d will depend on a given application and will be apparent in light of this disclosure.

In accordance with some embodiments, III-N semiconductor layer 110b may be thinned down in z-thickness (e.g., to provide a resonator device 101b of a given target resonance frequency or frequencies). For instance, III-N semiconductor layer 110b may undergo selective removal of one or more of its constituent layers. To that end, removal of III-N semiconductor layer 110b material may be provided via any one, or combination, of a dry etch process and a wet etch process, the etch chemistry of which may be customized, as desired for a given target application or end-use. In accordance with some embodiments, the applied etch chemistry may be comprised of sulfur hexafluoride ($SF_6$). In some cases, nanometer-range precision may be achieved in removing III-N semiconductor layer 110b material, in accordance with some embodiments. By selectively removing material from III-N semiconductor layer 110b, fine tuning of the resonance frequency (or frequencies, as the case may be) of resonator device 101b may be achieved, in accordance with some embodiments. For example, in accordance with some embodiments, III-N semiconductor layer 110b may be thinned down to a z-thickness in the range of about 0.5-2 µm (e.g., about 0.5-1.25 µm, about 1.25-2 µm, or any other sub-range in the range of about 0.5-2 µm). At this example thickness range, the resultant resonator device 101b may have one or more resonance frequencies, for instance, in the range of about 2-8 GHz. Other suitable thickness ranges and associated resonance frequencies may be provided, as desired, in accordance with other embodiments.

The process flow may continue as in FIG. 14, which illustrates a cross-sectional view of the IC 100 of FIG. 13 after forming S/D contacts 138 for transistor device 101a and an electrode contact 140 and electrode layer 142 for resonator device 101b, in accordance with an embodiment of the present disclosure. As can be seen, S/D contacts 138 may be disposed within features 136a, 136b, over a topography provided, in part or in whole, by a given S/D portion 124, dielectric layer 120, and dielectric layer 134. Also, as can be seen from FIG. 14, electrode contact 140 may be disposed within feature 136c, over a topography provided, in part or in whole, by electrode layer 106, nucleation layer 108, III-N semiconductor layer 110b, dielectric layer 120, and dielectric layer 134. As can be seen further from FIG. 14, electrode layer 142 may be disposed within feature 136d, over a topography provided, in part or in whole, by III-N semiconductor layer 110b, dielectric layer 120, and dielectric layer 134

Each of S/D contacts 138, electrode contact 140, and electrode layer 142 may be comprised of any suitable electrically conductive material(s), as will be apparent in light of this disclosure. For instance, in some cases, any (or all) such layers may be comprised of any one, or combination, of tungsten (W), titanium (Ti), titanium nitride (TiN), or an alloy of any thereof, to name a few. Each of S/D contacts 138, electrode contact 140, and electrode layer 142 may be formed via any suitable standard, custom, or proprietary technique(s), as will be apparent in light of this disclosure. In accordance with some embodiments, any (or all) such layers may be formed via any one, or combination, of an electroplating process, an electroless deposition process, an ALD process, a PVD process, and a CVD process, among others. Any overburden of S/D contacts 138, electrode contact 140, and electrode layer 142 may be removed, for example, via a CMP process or other suitable planarization process, as will be apparent in light of this disclosure.

The dimensions (e.g., z-height in the z-direction) and geometry of each of S/D contacts 138, electrode contact 140, and electrode layer 142 may be customized, as desired for a given target application or end-use. For example, in accordance with some embodiments, a given S/D contact 138 may have a z-height sufficient to fill a given feature 136a, 136b and make electrical contact with a given S/D portion 124. In accordance with some embodiments, electrode contact 140 may have a z-height sufficient to fill feature 136c and make electrical contact with electrode layer 106. In accordance with some embodiments, electrode layer 142 may have a z-height sufficient to fill feature 136d and make electrical contact with III-N semiconductor layer 110b. Other suitable materials, formation techniques, configurations, and dimensions for S/D contacts 138, electrode contact 140, and electrode layer 142 will depend on a given application and will be apparent in light of this disclosure.

Figure 15:
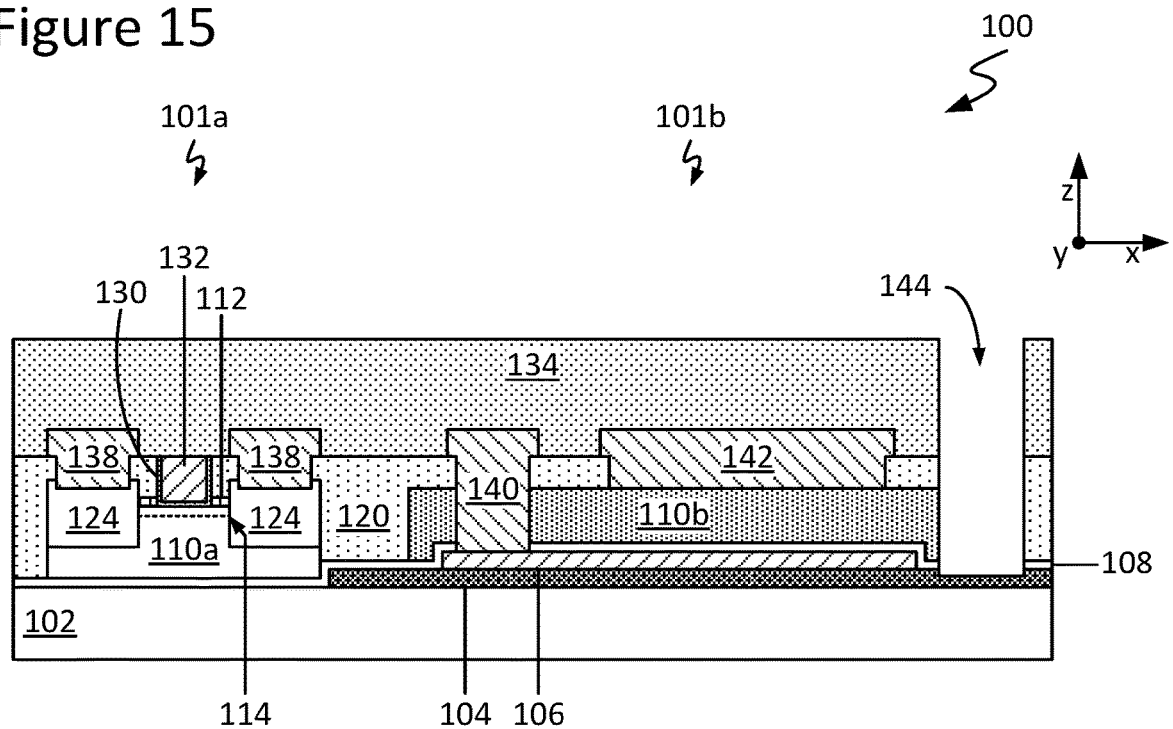

The process flow may continue as in FIG. 15, which illustrates a cross-sectional view of the IC 100 of FIG. 14 after further forming dielectric layer 134 and patterning with a feature 144, in accordance with an embodiment of the present disclosure. Further formation of dielectric layer 134 may be provided via any of the example techniques discussed above, for instance, with respect to forming dielectric layer 134 (e.g., in the context of FIG. 12), in accordance with some embodiments. Feature 144 may be, for example, a trench, via-hole, or other opening or recess that extends through a full thickness (e.g., z-thickness in the z-direction) of dielectric layer 134, dielectric layer 120, III-N semiconductor layer 110b, and nucleation layer 108, landing on and extending into dielectric layer 104. In forming feature 144, partial removal of dielectric layer 134, dielectric layer 120, III-N semiconductor layer 110b, and nucleation layer 108 may be provided via any standard, custom, or proprietary lithography, etch, and clean processes, as will be apparent in light of this disclosure. In some cases, dielectric layer 104 may serve, at least in part, as a stop point in forming feature 144. Moreover, the particular initial dimensions and geometry of feature 144 may be customized, as desired for a given target application or end-use. Other suitable formation techniques, configurations, and dimensions for feature 144 will depend on a given application and will be apparent in light of this disclosure.

Figure 16:
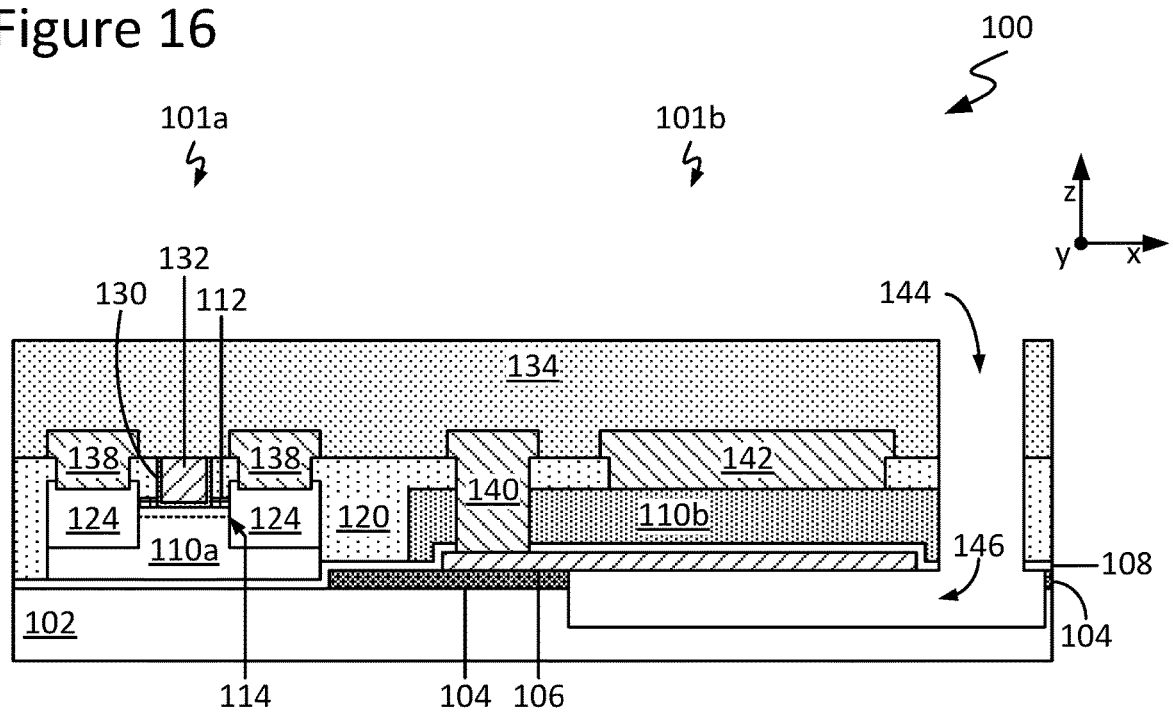

The process flow may continue as in FIG. 16, which illustrates a cross-sectional view of the IC 100 of FIG. 15 after forming a cavity 146, in accordance with an embodiment of the present disclosure. Partial (e.g., further) removal of dielectric layer 104 and partial removal of semiconductor substrate 102 to form cavity 146 may be provided via any one, or combination, of a dry etch process and a wet etch process, the etch chemistry of which may be customized, as desired for a given target application or end-use. As will be appreciated in light of this disclosure, the particular etch chemistry employed in forming cavity 146 may depend on the particular material composition of each of dielectric layer 104 and semiconductor substrate 102. Thus, for instance, if dielectric layer 104 is comprised of an oxide material, then an etchant comprised of hydrofluoric acid (HF) may be utilized in removing oxide material to form cavity 146, in accordance with some embodiments. If semiconductor substrate 102 is a Si substrate or a Si-on-insulator (SOI) of Si-on-sapphire (SOS) substrate, then an etchant comprised of potassium hydroxide (KOH) or tetra-methyl ammonium hydroxide (TMAH) (($CH_3$)$_4$NOH) may be utilized in removing Si material to form cavity 146, in accordance with some embodiments. If instead semiconductor substrate 102 is comprised of a Group III-V semiconductor material, such as GaAs or InP, for example, then an etchant comprised of phosphoric acid ($H_3PO_4$) containing hydrogen peroxide ($H_2O_2$) or comprised of a concentrated hydrochloric acid (HCl) or sulfuric acid ($H_2SO_4$) may be utilized in removing III-V material to form cavity 146, in accordance with some embodiments. Numerous other suitable etchants and etch schemes for various configurations of dielectric layer 104 and semiconductor substrate 102 will be apparent in light of this disclosure. Further note that the particular etch scheme employed may include either (or both) anisotropic and isotropic etching. In accordance with some embodiments, anisotropic etching may be utilized in forming feature 144, followed by isotropic etching to form cavity 146.

In accordance with some embodiments, the etchant(s) employed in forming cavity 146 may be delivered to dielectric layer 104 and semiconductor substrate 102 through feature 144, which may serve as a sort of passageway that channels the etchant(s) to the exposed surface and, eventually, interior of semiconductor substrate 102. In a general sense, each of dielectric layer 104 and semiconductor substrate 102 may be considered, in part or in whole, a sacrificial layer (e.g., in that at least a portion thereof may be intentionally removed from IC 100). In partially removing dielectric layer 104 and semiconductor substrate 102, cavity 146 may form under any one (or combination) of III-N semiconductor layer 110b, nucleation layer 108, and electrode layer 106 of resonator device 101b, in accordance with some embodiments. As will be appreciated in light of this disclosure, the particular quantity of cavities 146 may be customized, as desired for a given target application or end-use, and at least in some instances may be made to correspond with the particular quantity of resonator devices native to IC 100. Moreover, the particular dimensions and geometry of a given cavity 146 may be customized, as desired for a given target application or end-use. In etching thereunder, resonator device 101b may extend over cavity 146 in a generally cantilevered manner over semiconductor substrate 102, in accordance with some embodiments. Also, as can be seen from FIG. 16, a portion of dielectric layer 104 may remain disposed over semiconductor substrate 102, laterally adjacent to cavity 146, in accordance with some embodiments. In some instances, this remainder portion of dielectric layer 104 may be disposed, at least in part, under III-N semiconductor layer 110b.

Figure 17A:
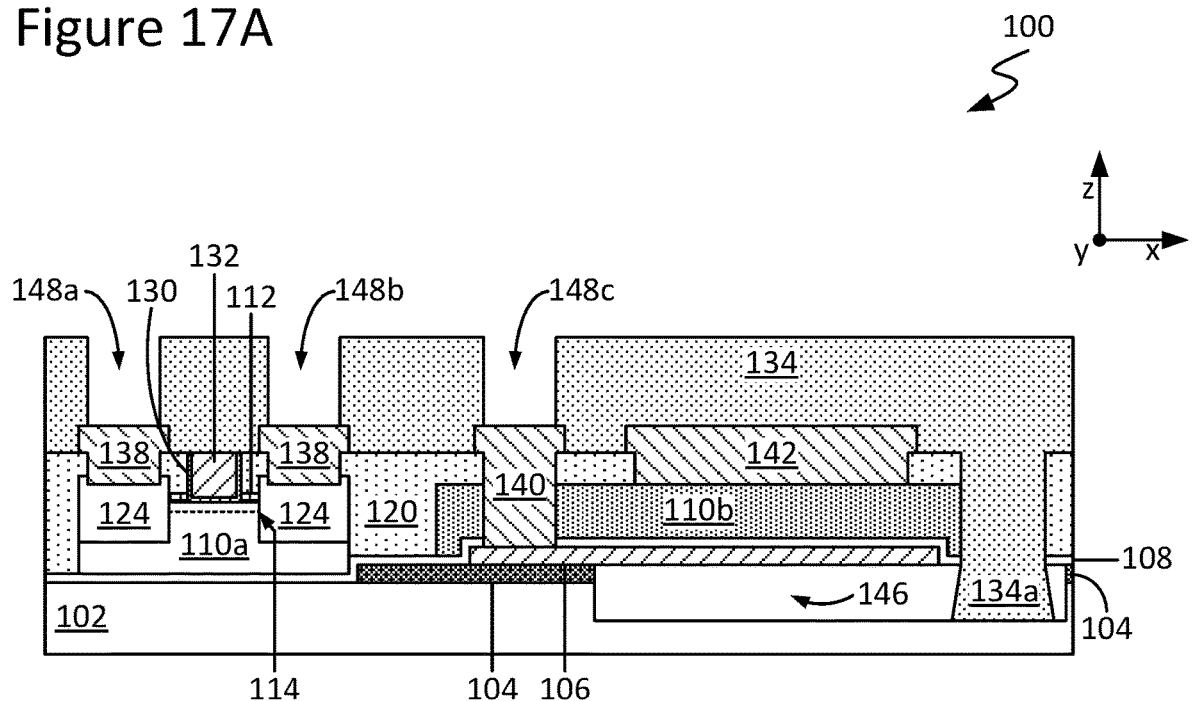
FIG. 17A illustrates a cross-sectional view of the IC of FIG. 16 after further forming a dielectric layer and patterning with features, in accordance with an embodiment of the present disclosure.

One or more electrical interconnection layers optionally may be formed over IC 100 to make any desired electrical connections for either (or both) of transistor device 101a and resonator device 101b, in accordance with some embodiments. To that end, the process flow of FIGS. 1-16 optionally may continue as in FIG. 17A, which illustrates a cross-sectional view of the IC 100 of FIG. 16 after further forming dielectric layer 134 and patterning with features 148a-148c, in accordance with an embodiment of the present disclosure. Further formation of dielectric layer 134 may be provided via any of the example techniques discussed above, for instance, with respect to forming dielectric layer 134 (e.g., in the context of FIG. 12), in accordance with some embodiments. Dielectric layer 134 may be further formed such that a portion 134a thereof extends through and thus plugs feature 144, landing on a bottom surface of cavity 146 (e.g., such as generally can be seen in FIG. 17A), in accordance with some embodiments. The particular dimensions and geometry of portion 134a may be customized, as desired for a given target application or end-use, and at least in some instances may depend, at least in part, on the particular dimensions and geometry of host feature 144 and cavity 146, in accordance with some embodiments. In some instances, portion 134a may flare outward in x-width within cavity 146, terminating in a generally tapered foot configuration (e.g., as generally shown in FIG. 17A).

Each of features 148a-148c may be, for example, a trench, via-hole, or other opening or recess. As can be seen, each of a first feature 148a and a second feature 148b may extend through a partial thickness of dielectric layer 134, landing on a given underlying S/D contact 138. A third feature 148c may extend through a partial thickness of dielectric layer 134, landing on electrode contact 140. In forming a given feature 148a-148c, partial removal of dielectric layer 134 may be provided via any standard, custom, or proprietary lithography, etch, and clean processes, as will be apparent in light of this disclosure. The particular dimensions (e.g., x-width in the x-direction; z-depth in the z-direction) and geometry of each of features 148a-148c may be customized, as desired for a given target application or end-use. In accordance with some embodiments, each of features 148a and 148b may be configured to host a S/D electrode 150 (discussed below). In accordance with some embodiments, feature 148c may be configured to host an electrode 152 (discussed below). Other suitable formation techniques, configurations, and dimensions for features 148a-148c will depend on a given application and will be apparent in light of this disclosure.

Figure 17B:
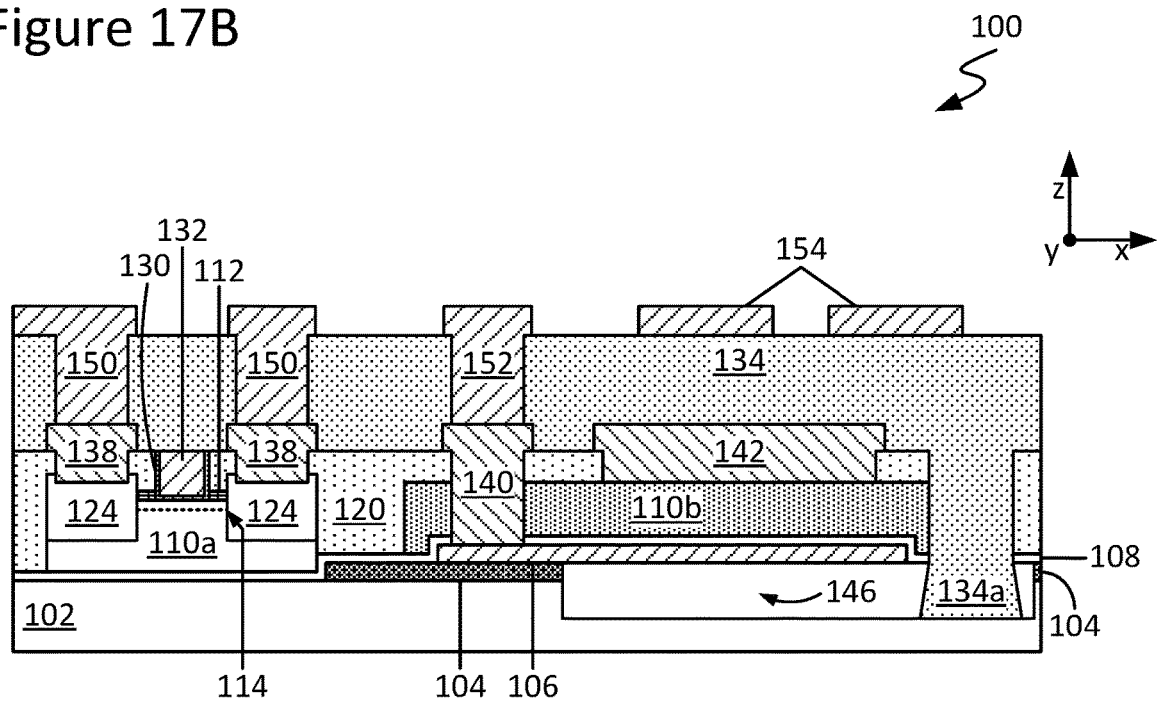
FIG. 17B illustrates a cross-sectional view of the IC of FIG. 17A after forming source/drain (S/D) electrodes and interconnects, in accordance with an embodiment of the present disclosure.

In addition, the process flow of FIGS. 1-16 optionally may continue as in FIG. 17B, which illustrates a cross-sectional view of the IC 100 of FIG. 17A after forming S/D electrodes 150, an electrode 152, and interconnects 154, in accordance with an embodiment of the present disclosure. As can be seen, a given electrode 150 may be disposed within a given feature 148a, 148b, over a topography provided, in part or in whole, by a given underlying S/D contact 138 and dielectric layer 134. Also, as can be seen, electrode 152 may be disposed within feature 148c, over a topography provided, in part or in whole, by underlying electrode contact 140 and dielectric layer 134. As can be seen further, interconnects 154 may be disposed over a topography provided, in part or in whole, by dielectric layer 134.

Each of S/D electrodes 150, electrode 152, and interconnects 154 may be provided with any of the example materials and formation techniques discussed above, for instance, with respect to S/D contacts 138, electrode contact 140, and electrode layer 142, in accordance with some embodiments. Moreover, the dimensions (e.g., z-height in the z-direction) and geometry of each of S/D electrodes 150, electrode 152, and interconnects 154 may be customized, as desired for a given target application or end-use. In accordance with some embodiments, a given S/D electrode 150 may have a z-height sufficient to fill a given feature 148a, 148b and make electrical contact with a given S/D contact 138. In accordance with some embodiments, electrode 152 may have a z-height sufficient to fill feature 148c and make electrical contact with electrode contact 140. In accordance with some embodiments, interconnects 154 may have a z-height sufficient to provide a given desired electrical connection of IC 100 with one or more other circuit layers. A given S/D electrode 150, electrode 152, or interconnect 154 may be configured for electrical contact, for example, with an on-die matching network, in accordance with some embodiments. Other suitable materials, formation techniques, configurations, and dimensions for S/D electrodes 150, electrode 152, and interconnects 154 will depend on a given application and will be apparent in light of this disclosure.

As discussed herein, the various constituent layers of IC 100 may have any of a wide range of thicknesses (e.g., z-thicknesses in the z-direction, x-thicknesses in the x-direction, or other designated thickness), as desired for a given target application or end-use. In some instances, a given layer may be provided as a monolayer over an underlying topography. For a given IC configured as described herein, in some cases, a given constituent layer thereof may have a substantially uniform thickness over an underlying topography. In some instances, a given constituent layer may be provided as a substantially conformal layer over an underlying topography. In other instances, a given constituent layer may be provided with a non-uniform or otherwise varying thickness over an underlying topography. For example, in some cases, a first portion of a given layer may have a thickness within a first range, whereas a second portion thereof may have a thickness within a second, different range. In some instances, a given layer may have first and second portions having average thicknesses that are different from one another by about 20% or less, about 15% or less, about 10% or less, or about 5% or less. Numerous configurations and variations will be apparent in light of this disclosure.

Furthermore, as discussed herein, the various constituent layers of IC 100 may be disposed over one or more other constituent layers. In some cases, a first constituent layer may be disposed directly on a second constituent layer with no layers intervening. In some other cases, one or more intervening layers may be disposed between a first constituent layer and a second constituent layer underlying. In a more general sense, a given constituent layer may be disposed superjacent to another given constituent layer, optionally with one or more intervening layers, in accordance with some embodiments.

Example System

Figure 18:
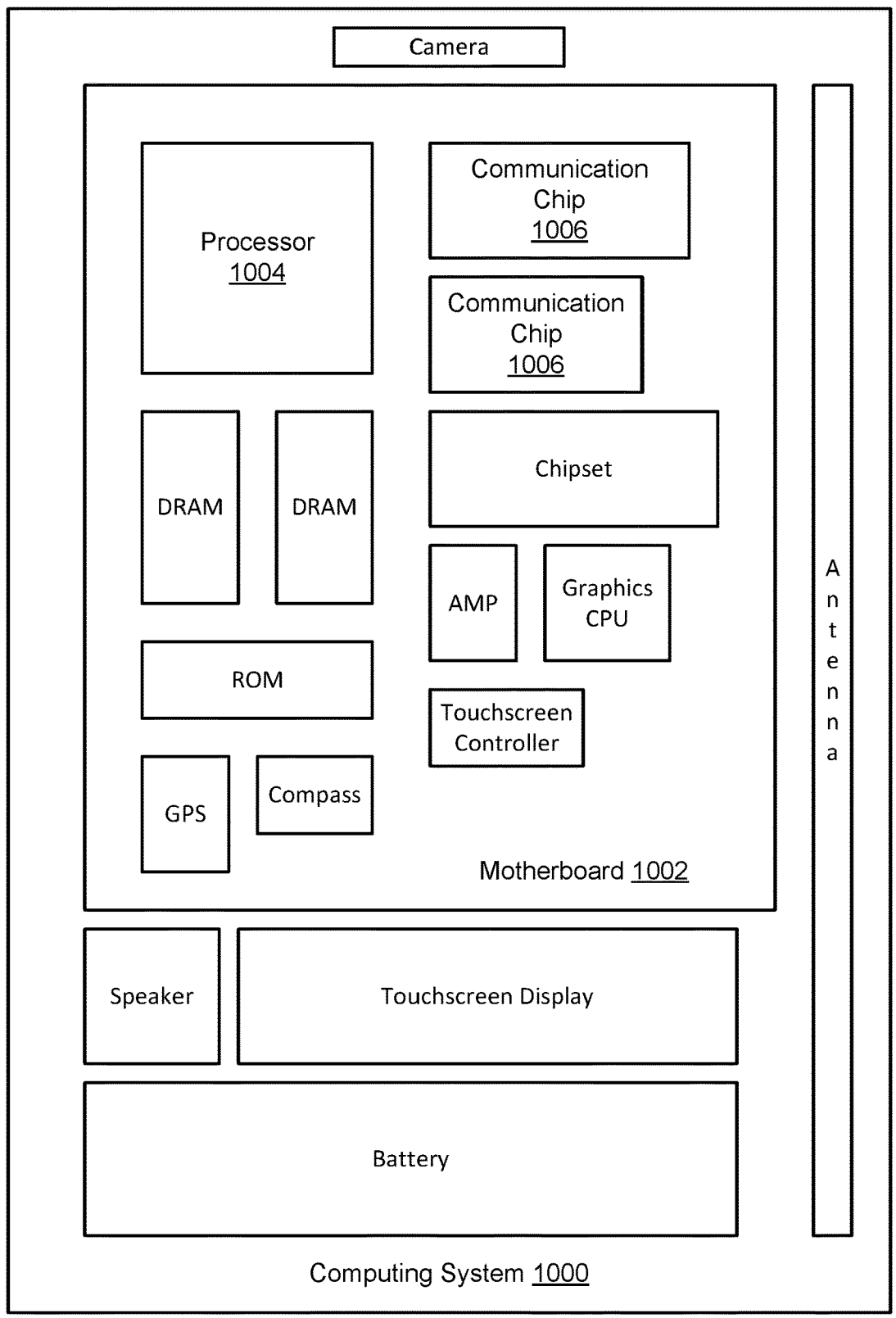
FIG. 18 illustrates a computing system implemented with IC structures or devices formed using the disclosed techniques in accordance with an example embodiment.

FIG. 18 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit including: a semiconductor substrate having a cavity formed therein; a III-N semiconductor transistor device disposed over a first portion of the semiconductor substrate and including a monocrystalline III-N semiconductor layer; and a resonator device disposed over a second portion of the semiconductor substrate such that the cavity extends under the resonator device, the resonator device including a polycrystalline piezoelectric III-N semiconductor layer.

Example 2 includes the subject matter of any of Examples 1 and 3-10, wherein the III-N semiconductor transistor device further includes: a polarization layer disposed over the monocrystalline III-N semiconductor layer; a gate dielectric layer disposed over the polarization layer; a gate layer disposed over the gate dielectric layer; a first source/drain (S/D) portion disposed over a first region of the monocrystalline III-N semiconductor layer, adjacent the polarization layer; and a second S/D portion disposed over a second region of the monocrystalline III-N semiconductor layer, adjacent the polarization layer.

Example 3 includes the subject matter of Example 2, wherein the polarization layer includes either: aluminum indium nitride ($Al_xIn_{1-x}N$), wherein x is in the range of about 0.7-0.99; aluminum gallium nitride ($Al_xGa_{1-x}N$), wherein x is in the range of about 0.05-0.5; or aluminum indium gallium nitride ($Al_xIn_yGa_{1-x-y}N$), wherein x is in the range of about 0.01-0.9 and y is in the range of about 0.01-0.1.

Example 4 includes the subject matter of Example 2, wherein at least one of the first S/D portion and the second S/D portion includes at least one of gallium nitride (GaN), indium gallium nitride (InGaN), and indium nitride (InN) and is doped with at least one of silicon (Si) and germanium (Ge).

Example 5 includes the subject matter of Example 2, wherein the III-N semiconductor transistor device further includes: a first S/D contact disposed over the first S/D portion; and a second S/D contact disposed over the second S/D portion.

Example 6 includes the subject matter of Example 5, wherein the III-N semiconductor transistor device further includes: a first electrode disposed over the first S/D contact; and a second electrode disposed over the second S/D contact.

Example 7 includes the subject matter of any of Examples 1-6 and 8-10, wherein the resonator device further includes at least one of: a first electrode disposed on a first side of the polycrystalline piezoelectric III-N semiconductor layer; and a second electrode disposed on a second side of the polycrystalline piezoelectric III-N semiconductor layer.

Example 8 includes the subject matter of Example 7, wherein at least one of the first electrode and the second electrode includes at least one of tungsten (W), molybdenum (Mo), tantalum nitride (TaN), titanium nitride (TiN), and an alloy of any thereof.

Example 9 includes the subject matter of any of Examples 1-8 and 10 and further includes a dielectric layer disposed over the semiconductor substrate, laterally adjacent to the cavity.

Example 10 includes the subject matter of any of Examples 1-9 and further includes a dielectric layer disposed over the polycrystalline piezoelectric III-N semiconductor layer and extending into the cavity.

Example 11 is a method of fabricating an integrated circuit, the method including: forming a III-N semiconductor transistor device over a first portion of a semiconductor substrate, the III-N semiconductor transistor device including a monocrystalline III-N semiconductor layer; forming a resonator device over a second portion of the semiconductor substrate, the resonator device including a polycrystalline piezoelectric III-N semiconductor layer; and forming a cavity within the semiconductor substrate, wherein the cavity extends under the resonator device.

Example 12 includes the subject matter of any of Examples 11 and 13-20, wherein the III-N semiconductor transistor device further includes: a polarization layer disposed over the monocrystalline III-N semiconductor layer; a gate dielectric layer disposed over the polarization layer; a gate layer disposed over the gate dielectric layer; a first source/drain (S/D) portion disposed over a first region of the monocrystalline III-N semiconductor layer, adjacent the polarization layer; and a second S/D portion disposed over a second region of the monocrystalline III-N semiconductor layer, adjacent the polarization layer.

Example 13 includes the subject matter of Example 12, wherein the polarization layer includes either: aluminum indium nitride ($Al_xIn_{1-x}N$), wherein x is in the range of about 0.7-0.99; aluminum gallium nitride ($Al_xGa_{1-x}N$), wherein x is in the range of about 0.05-0.5; or aluminum indium gallium nitride ($Al_xIn_{1-x-y}Ga_{1-x-y}N$), wherein x is in the range of about 0.01-0.9 and y is in the range of about 0.01-0.1.

Example 14 includes the subject matter of Example 12, wherein at least one of the first S/D portion and the second S/D portion includes at least one of gallium nitride (GaN), indium gallium nitride (InGaN), and indium nitride (InN) and is doped with at least one of silicon (Si) and germanium (Ge).

Example 15 includes the subject matter of Example 12, wherein the III-N semiconductor transistor device further includes: a first S/D contact disposed over the first S/D portion; and a second S/D contact disposed over the second S/D portion.

Example 16 includes the subject matter of Example 15, wherein the III-N semiconductor transistor device further includes: a first electrode disposed over the first S/D contact; and a second electrode disposed over the second S/D contact.

Example 17 includes the subject matter of any of Examples 11-16 and 18-20, wherein the resonator device further includes at least one of: a first electrode disposed on a first side of the polycrystalline piezoelectric III-N semiconductor layer; and a second electrode disposed on a second side of the polycrystalline piezoelectric III-N semiconductor layer.

Example 18 includes the subject matter of Example 17, wherein at least one of the first electrode and the second electrode includes at least one of tungsten (W), molybdenum (Mo), tantalum nitride (TaN), titanium nitride (TiN), and an alloy of any thereof.

Example 19 includes the subject matter of any of Examples 11-18 and 20 and further includes forming a dielectric layer over the semiconductor substrate, laterally adjacent to the cavity.

Example 20 includes the subject matter of any of Examples 11-19 and further includes forming a dielectric layer disposed over the polycrystalline piezoelectric III-N semiconductor layer and extending into the cavity.

Example 21 is an integrated circuit including: a semiconductor substrate; a transistor device disposed over a first portion of the semiconductor substrate and including a monocrystalline gallium nitride (GaN) layer; and a thin-film bulk acoustic resonator (TFBAR) device disposed over a second portion of the semiconductor substrate, the TFBAR device including a polycrystalline GaN layer.

Example 22 includes the subject matter of any of Examples 21 and 23-27, wherein the transistor device further includes: a polarization layer disposed over the monocrystalline GaN layer; a gate dielectric layer disposed over the polarization layer; a gate layer disposed over the gate dielectric layer; a first source/drain (S/D) portion disposed over a first region of the monocrystalline GaN layer, adjacent the polarization layer; and a second S/D portion disposed over a second region of the monocrystalline GaN layer, adjacent the polarization layer.

Example 23 includes the subject matter of any of Examples 21-22 and 24-27, wherein the TFBAR device further includes: a first electrode disposed on a first side of the polycrystalline GaN layer; and a second electrode disposed on a second side of the polycrystalline GaN layer; wherein at least one of the first electrode and the second electrode includes an electrically conductive refractory material.

Example 24 includes the subject matter of any of Examples 21-23 and 26-27, wherein the semiconductor substrate includes a Group IV semiconductor material.

Example 25 includes the subject matter of any of Examples 21-23 and 26-27, wherein the semiconductor substrate includes a Group III-V compound semiconductor material.

Example 26 includes a radio frequency (RF) filter including an integrated circuit including the subject matter of any of Examples 21-25 and 27.

Example 27 includes a mobile computing device including an RF filter including the subject matter of Example 26.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
   a substrate having a cavity therein;
   a transistor device over a first portion of the substrate and comprising a monocrystalline III-N semiconductor layer;
   a resonator device over a second portion of the substrate such that the cavity extends under the resonator device, the resonator device comprising a polycrystalline piezoelectric III-N semiconductor layer; and
   a dielectric layer at least partially under the polycrystalline piezoelectric III-N semiconductor layer so as to be between the polycrystalline piezoelectric III-N semiconductor layer and the substrate, wherein the dielectric layer is not under at least a section of the monocrystalline piezoelectric III-N semiconductor layer, so as to not be present between at least the section of the monocrystalline III-N semiconductor layer and the substrate.

2. The integrated circuit of claim 1, wherein the resonator device further comprises at least one of:
   a first electrode on a first side of the polycrystalline piezoelectric III-N semiconductor layer; and
   a second electrode on a second side of the polycrystalline piezoelectric III-N semiconductor layer,
   wherein at least one of the first electrode and the second electrode comprises at least one of tungsten, molybdenum, tantalum, titanium, and nitrogen.

3. The integrated circuit of claim 1, wherein:
   the dielectric layer is a first dielectric layer that is over the substrate, and laterally adjacent to the cavity; and
   a second dielectric layer over the polycrystalline piezoelectric III-N semiconductor layer and extending into the cavity.

4. The integrated circuit of claim 1, further comprising:
   a continuous structure comprising aluminum and nitrogen, the continuous structure between the substrate and the monocrystalline III-N semiconductor layer, and the continuous structure also between the substrate and the polycrystalline piezoelectric III-N semiconductor layer.

5. The integrated circuit of claim 4, wherein:
   a first section of the continuous structure in direct contact with the monocrystalline III-N semiconductor layer is also in direct contact with the substrate; and
   a second section of the continuous structure in direct contact with the polycrystalline piezoelectric III-N semiconductor layer is separated from the substrate by one or both of a dielectric layer and an electrode.

6. The integrated circuit of claim 1, wherein the transistor device further comprises:
   a third layer comprising aluminum and nitrogen over the monocrystalline III-N semiconductor layer;
   a gate dielectric layer over the third layer;
   a gate electrode over the gate dielectric layer;
   a source portion over a first region of the monocrystalline III-N semiconductor layer, adjacent the third layer; and
   a drain portion over a second region of the monocrystalline III-N semiconductor layer, adjacent the third layer.

7. The integrated circuit of claim 6, wherein the third layer comprises at least one of:
   aluminum indium nitride ($Al_xIn_{1-x}N$), wherein x is in the range of 0.7-0.99;
   aluminum gallium nitride ($Al_xGa_{1-x}N$), wherein x is in the range of 0.05-0.5; and/or
   aluminum indium gallium nitride ($Al_xIn_yGa_{1-x-y}N$), wherein x is in the range of 0.01-0.9 and y is in the range of 0.01-0.1.

8. The integrated circuit of claim 6, wherein at least one of the source portion and the drain portion comprises nitrogen and at least one of gallium and indium, and wherein at least one of the source portion and the drain portion is doped with at least one of silicon (Si) and germanium (Ge).

9. The integrated circuit of claim 6, wherein the third layer comprises aluminum, nitrogen, and one or both of gallium and indium.

10. The integrated circuit of claim 6, wherein the transistor device further comprises:
    a first contact over the source portion; and
    a second contact over the drain portion.

11. The integrated circuit of claim 10, wherein the transistor device further comprises:
    a first electrode over the first contact; and
    a second electrode over the second contact.

12. A method of fabricating an integrated circuit, the method comprising:
    forming a transistor device over a first portion of a substrate, the substrate comprising semiconductor material, and the transistor device comprising a monocrystalline III-N semiconductor layer;
    forming a resonator device over a second portion of the substrate, the resonator device comprising a polycrystalline piezoelectric III-N semiconductor layer;
    forming a cavity within the substrate, wherein the cavity extends under the resonator device; and
    performing at least one of
        prior to forming the cavity, forming a first layer comprising dielectric material over the substrate, laterally adjacent to the cavity; and/or
        after forming the cavity, forming a second layer comprising dielectric material over the polycrystalline piezoelectric III-N semiconductor layer and extending into the cavity.

13. The method of claim 12, wherein forming the transistor device comprises:
    forming a third layer over the monocrystalline III-N semiconductor layer;
    forming a fourth layer over the third layer;
    forming a fifth layer over the fourth layer;
    forming a source portion over a first region of the monocrystalline III-N semiconductor layer, adjacent the third layer; and
    forming a drain portion over a second region of the monocrystalline III-N semiconductor layer, adjacent the third layer;
    wherein the third layer comprises either
        aluminum indium nitride ($Al_xIn_{1-x}N$) with x in the range of 0.7-0.99;

aluminum gallium nitride ($Al_xGa_{1-x}N$) with x in the range of 0.05-0.5; or aluminum indium gallium nitride ($Al_xIn_yGa_{1-x-y}N$) with x in the range of 0.01-0.9 and y in the range of 0.01-0.1;

wherein the fourth layer comprises a gate dielectric material; and wherein the fifth layer comprises a gate electrode material.

14. An integrated circuit comprising:

a substrate;

a transistor device over a first portion of the substrate and comprising a monocrystalline layer including gallium and nitrogen;

an acoustic resonator device over a second portion of the substrate, the acoustic resonator device comprising a polycrystalline layer including gallium and nitrogen;

a third layer on the monocrystalline layer and comprising aluminum and nitrogen, wherein a two-dimensional electron gas (2DEG) is inducible in the monocrystalline layer;

a gate dielectric layer over the third layer; and a gate electrode over the gate dielectric layer.

15. The integrated circuit of claim 14, wherein the transistor device further comprises:

a drain portion over a first region of the monocrystalline layer, adjacent the polarization layer; and a source portion over a second region of the monocrystalline layer, adjacent the polarization layer.

16. The integrated circuit of claim 14, wherein the acoustic resonator device further comprises:

a first electrode on a first side of the polycrystalline layer; and a second electrode on a second side of the polycrystalline layer;

wherein at least one of the first electrode and the second electrode comprises an electrically conductive refractory material.

17. The integrated circuit of claim 14, wherein the substrate comprises at least one of a Group IV semiconductor material and a Group III-V compound semiconductor material.

18. A radio frequency (RF) filter circuit comprising the integrated circuit of claim 14.

* * * * *